United States Patent
Sadiq et al.

(10) Patent No.: US 10,868,569 B2
(45) Date of Patent: Dec. 15, 2020

(54) PBCH SIGNAL DESIGN AND EFFICIENT CONTINUOUS MONITORING AND POLAR DECODING

(71) Applicant: QUALCOMM Incorporated, San Diego, CA (US)

(72) Inventors: Bilal Sadiq, Basking Ridge, NJ (US); Jamie Menjay Lin, San Diego, CA (US); Yang Yang, San Diego, CA (US); Gabi Sarkis, San Diego, CA (US); Tao Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/971,967

(22) Filed: May 4, 2018

(65) Prior Publication Data
US 2018/0323804 A1 Nov. 8, 2018

Related U.S. Application Data

(60) Provisional application No. 62/503,253, filed on May 8, 2017, provisional application No. 62/518,589, filed on Jun. 12, 2017.

(51) Int. Cl.
*H03M 13/13* (2006.01)
*H04L 5/00* (2006.01)
(Continued)

(52) U.S. Cl.
CPC ......... *H03M 13/13* (2013.01); *H03M 13/356* (2013.01); *H03M 13/3715* (2013.01);
(Continued)

(58) Field of Classification Search
CPC ............... H03M 13/13; H03M 13/356; H03M 13/3715; H03M 13/3723; H03M 13/612;
(Continued)

(56) References Cited

U.S. PATENT DOCUMENTS 10,312,939 B2 * 6/2019 Richardson ........ H03M 13/1168
10,560,910 B2    2/2020 Sadiq et al.
(Continued)

OTHER PUBLICATIONS

Ericsson: "CR 25.212-049: Editorial Changes to Annex A," 3GPP Draft, R1-00-0243 CR25212-049 Annex, 3rd Generation Partnership Project (3GPP), Mobile Competence Centre, 650, Route Des Lucioles, F-06921 Sophia-Antipolis Cedex, France, vol. RAN WG1, No. San Diego, USA, Feb. 22, 2000, Feb. 22, 2000 (Feb. 22, 2000), XP050091935, 5 Pages, [retrieved on Feb. 22, 2000].
(Continued)

*Primary Examiner* — John J Tabone, Jr.
(74) *Attorney, Agent, or Firm* — Haynes and Boone, LLP

(57) ABSTRACT

Wireless communications systems and methods are introduced. A wireless communication device may arrange a first encoded information block including a first sub-block having a first bit location and a second sub-block having a second bit location. The second bit location is after the first bit location. The wireless communication device may also position the first location earlier in a decoding order of a receiving second wireless communication than the second bit location. The wireless communication device may transmit the first and second sub-blocks as an encoded information block to the second wireless communication device.

53 Claims, 22 Drawing Sheets

(51) Int. Cl.
*H04L 1/00* (2006.01)
*H03M 13/37* (2006.01)
*H03M 13/35* (2006.01)
*H03M 13/00* (2006.01)
*H04W 72/04* (2009.01)
*H03M 13/29* (2006.01)
*H03M 13/23* (2006.01)
*H03M 13/11* (2006.01)

(52) U.S. Cl.
CPC ..... *H03M 13/3723* (2013.01); *H03M 13/612* (2013.01); *H04L 1/0041* (2013.01); *H04L 1/0053* (2013.01); *H04L 1/0057* (2013.01); *H04L 5/0051* (2013.01); *H03M 13/1102* (2013.01); *H03M 13/23* (2013.01); *H03M 13/2957* (2013.01); *H04L 1/0042* (2013.01); *H04W 72/0446* (2013.01)

(58) Field of Classification Search
CPC ............. H03M 13/1102; H03M 13/23; H03M 13/2957; H04L 1/0041; H04L 1/0053; H04L 1/0057; H04L 5/0051; H04L 1/0042; H04W 72/0446
USPC .................................. 714/752, 786, 799, 821
See application file for complete search history.

(56) References Cited

U.S. PATENT DOCUMENTS

| | | | | |
|---|---|---|---|---|
| 2002/0181594 | A1* | 12/2002 | Katsavounidis | H03M 7/30 375/240.24 |
| 2011/0105107 | A1 | 5/2011 | Kwon et al. | |
| 2016/0182187 | A1* | 6/2016 | Kim | H03M 13/09 714/807 |
| 2016/0269050 | A1* | 9/2016 | Shen | H03M 13/13 |
| 2017/0222754 | A1* | 8/2017 | Noh | H04L 1/0045 |
| 2018/0019766 | A1* | 1/2018 | Yang | H03M 13/13 |
| 2018/0035427 | A1* | 2/2018 | Gupta | H04L 1/0003 |
| 2018/0048349 | A1* | 2/2018 | Sun | H04B 1/7075 |
| 2018/0192403 | A1* | 7/2018 | Shelby | H04L 1/0041 |
| 2018/0198469 | A1* | 7/2018 | Sarkis | H03M 13/13 |
| 2018/0198555 | A1 | 7/2018 | Wu et al. | |
| 2018/0198560 | A1* | 7/2018 | Jiang | H03M 13/13 |
| 2018/0198561 | A1* | 7/2018 | Tsai | H04L 5/0064 |
| 2018/0199350 | A1* | 7/2018 | John Wilson | H04W 72/085 |
| 2018/0279243 | A1* | 9/2018 | Sadiq | H04L 1/0054 |
| 2018/0294922 | A1* | 10/2018 | Li | H04L 1/0071 |
| 2018/0323803 | A1 | 11/2018 | Palgy et al. | |
| 2018/0323804 | A1 | 11/2018 | Sadiq et al. | |
| 2018/0324022 | A1 | 11/2018 | Sheng et al. | |
| 2018/0359714 | A1 | 12/2018 | Sadiq et al. | |
| 2020/0205099 | A1 | 6/2020 | Sadiq et al. | |

OTHER PUBLICATIONS

Huawei et al., "Channel Coding for PBCH," 3GPP Draft, R1-1704249, 3rd Generation Partnership Project (3GPP), Mobile Competence Centre, 650, Route Des Lucioles, F-06921 Sophia-Antipolis Cedex, France, vol. RAN WG1, No. Spokane USA, Apr. 3, 2017-Apr. 7, 2017, Apr. 2, 2017 (Apr. 2, 2017), XP051242401, 6 Pages, Retrieved from the Internet: URL:http://www.3gpp.org/ftp/Meetings_3GPP_SYNC/RAN1/Docs/ [retrieved on Apr. 2, 2017].

Huawei., et al., "Polar Code Construction for NR," 3GPP Draft; R1-1608862, 3GPP TSG RAN WG1 Meeting #86bis, Lisbon, Portugal, Oct. 9, 2016 (Oct. 9, 2016), 8 pages, Retrieved from the Internet: URL: http://www.3gpp.org/ftp/Meetings_3GPP_SNC/RAN1/Docs/.

International Search Report and Written Opinion—PCT/US2018/031414—ISA/EPO—dated Jul. 17, 2018.

Mediatek Inc: "PBCH Enhancement with Polar Code", 3GPP Draft; R1-1700169_PBCH Enhancement with Polar Code Final, 3rd Generation Partnership Project (3GPP), Mobile Competence Centre, 650, Route Des Lucioles, F-06921, Sophia-Antipolis Cedex, France, vol. RAN WGI, No. Spokane, USA; Jan. 16, 2017-Jan. 20, 2017, Jan. 16, 2017 (Jan. 16, 2017), 5 Pages, XP051207711, Retrieved from the Internet: URL: http://www.3gpp.org/ftp/Meetings_3GPP_SYNC/RAN1/Docs/ [retrieved on Jan. 16, 2017].

Qualcomm Incorporated: "PBCH Channel Coding", 3GPP Draft; R1-1700837 PBCH Channel Coding, 3rd Generation-Partnership Project (3GPP), Mobile Competence Centre; 650, Route Des Lucioles; F-06921 Sophia-Antipolis Cedex; France, vol. RAN WG1, No. Spokane, WA; Jan. 16, 2017-Jan. 20, 2017, Jan. 16, 2017 (Jan. 16, 2017), pp. 1-3, XP051208356, Retrieved from the Internet: URL: http://www.3gpp.org/ftp/Meetings_3GPP_SYNC/RAN1/Docs/ [retrieved on Jan. 16, 2017].

"3GPP TS 38.212; 3rd Generation Partnership Project; Technical Specification Group Radio Access Network; NR; Multiplexing and channel coding (Release 15)", V15.4.0, Dec. 2018, 97 pages.

* cited by examiner

PBCH SIGNAL DESIGN AND EFFICIENT CONTINUOUS MONITORING AND POLAR DECODING

CROSS REFERENCE TO RELATED APPLICATIONS

The present application claims priority to and the benefit of the U.S. Provisional Patent Application No. 62/503,253, filed May 8, 2017, and U.S. Provisional Patent Application No. 62/518,589, filed Jun. 12, 2017, which are each hereby incorporated by reference in their entirety as if fully set forth below in their entirety and for all applicable purposes.

TECHNICAL FIELD

This application relates to wireless communication systems, and more particularly to systems and methods that allow wireless communication devices of a radio access network (RAN) to have low latency communication and reduced power consumption.

INTRODUCTION

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system). A wireless multiple-access communications system may include a number of base stations (BSs), each simultaneously supporting communication for multiple communication devices, which may be otherwise known as user equipment (UE).

To meet the growing demands for expanded connectivity, wireless communication technologies or radio access technologies are advancing from the LTE technology to a next generation new radio (NR) technology. One technique for expanding connectivity may be to extend the frequency operation range to higher frequencies since the lower frequencies are becoming over-crowded. For example, LTE may operate between a low-frequency range (e.g., below 1 gigahertz (GHz)) to a mid-frequency range (e.g., between about 1 GHz to about 3 GHz) and the next generation NR may operate in a high-frequency range (e.g., between about 3 GHz to about 30 GHz).

In the next generation NR, the payload size may grow and may lead to decoding complexities, for example due to a more complex coding scheme. This increase in complexity, both based on coding scheme and payload size (e.g., a combination of both), can cause latency issues and may drain more power from the UE. Efficiency for continuous physical broadcast channel (PBCH) monitoring and decoding, as a result, poses new challenges in the next generation NR. In particular, since a UE passing the synchronization phase typically continuously and repeatedly decodes PBCH in the idle state, the decoding latency, efficiency, and power consumption can become an important differentiating factor in the next generation NR technology that stands in need of improvement.

BRIEF SUMMARY OF SOME EXAMPLES

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Wireless communication devices connected to a wireless communications system can be required to continuously communicate with the wireless communication system to synchronize with the wireless communications system. As part of the synchronization process, wireless communication devices may continuously receive master information blocks (MIBs) from the physical broadcast channel (PBCH). A master information block may be encoded; thus, the wireless communication devices may be required to decode the content of the MIB and then may use the information in the decoded MIB to synchronize with the PBCH. Decoding the signal transmitted by the PBCH, i.e., decoding the MIBs, may cause latency and may drain a great amount of power. The methods and systems discussed blow address the issues of latency and power consumption related to decoding the MIBs.

Embodiments of the present disclosure provide a method of wireless communication that includes arranging, by a first wireless communication device, first information into a first sub-block having a first bit location and second information into a second sub-block having a second bit location after the first bit location. The method further includes positioning, by the first wireless communication device, the first bit location earlier in a decoding order of a receiving second wireless communication device than the second bit location. The method further includes transmitting, by the first wireless communication device, the first sub-block and the second sub-block as an encoded information block to the second wireless communication device.

In an additional aspect of the disclosure, a method of wireless communication includes receiving, by a first wireless communication device, an encoded information block from a second wireless communication device, the encoded information block comprising a first sub-block having a first bit location and a second sub-block having a second bit location after the first bit location. The method further includes decoding, by the first wireless communication device, the first sub-block. The method further includes decoding, by the first wireless communication device, the second sub-block after the first sub-block.

Embodiments of the present disclosure further include a method of wireless communication that includes receiving a first encoded information block including a first sub-block and a second sub-block by a wireless communication device. The first sub-block includes information that more frequently changes than the second sub-block. The method further includes receiving a second encoded information block including a third sub-block and a fourth sub-block by the wireless communication device. The third sub-block may be associated with the first sub-block and the fourth sub-block may be associated with the second sub-block. The method also includes determining a correlation value between the second sub-block and the fourth sub-block by the wireless communication device and also decoding the fourth sub-block of the second encoded information block based on the determining by the wireless communication device.

In an additional aspect of the disclosure, a method of wireless communication includes receiving a first encoded information block including a first sub-block and a second sub-block by a wireless communication device. The first sub-block includes information that more frequently changes than the second sub-block. The method includes receiving a second encoded information block including a third sub-block and a fourth sub-block by the wireless communication device. The third sub-block may be associated with the first sub-block the fourth sub-block may be associated with the second sub-block. The method also includes determining a fifth sub-block based on at least the second sub-block and an expected information by the wireless communication device. The method further includes determining a correlation value between the second sub-block and the fifth sub-block and decoding the fourth sub-block of the second encoded information block based on the determining by the wireless communication device.

In an additional aspect of the disclosure, a method of wireless communication includes transmitting a first encode information block including a first sub-block and a second sub-block by a wireless communication device. The first sub-block may include information that more frequently changes than the second sub-block. The second sub-block may be positioned subsequent to the first sub-block in the first encoded information block. The method also includes transmitting a second encoded information block that may include a third sub-block and a fourth sub-block. The third sub-block may be associated with the first sub-block and the fourth sub-block may be associated with the second sub-block. The fourth sub-block may be positioned subsequent to the third sub-block in the second encoded information block.

In an additional aspect of the disclosure, an apparatus comprises a processor configured to arrange first information into a first sub-block having a first bit location and second information into a second sub-block having a second bit location after the first bit location. The processor is further configured to position the first bit location earlier in a decoding order of a wireless communication device than the second bit location. The apparatus further comprises a transceiver configured to: transmit the first sub-block and the second sub-block as an encoded information block to the wireless communication device.

In an additional aspect of the disclosure, an apparatus comprises a transceiver configured to receive, by the apparatus, an encoded information block from a wireless communication device, the encoded information block comprising a first sub-block having a first bit location and a second sub-block having a second bit location after the first bit location. The apparatus further comprises a processor configured to decode the first sub-block and decode the second sub-block after the first sub-block.

Additional aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

Figure 1:
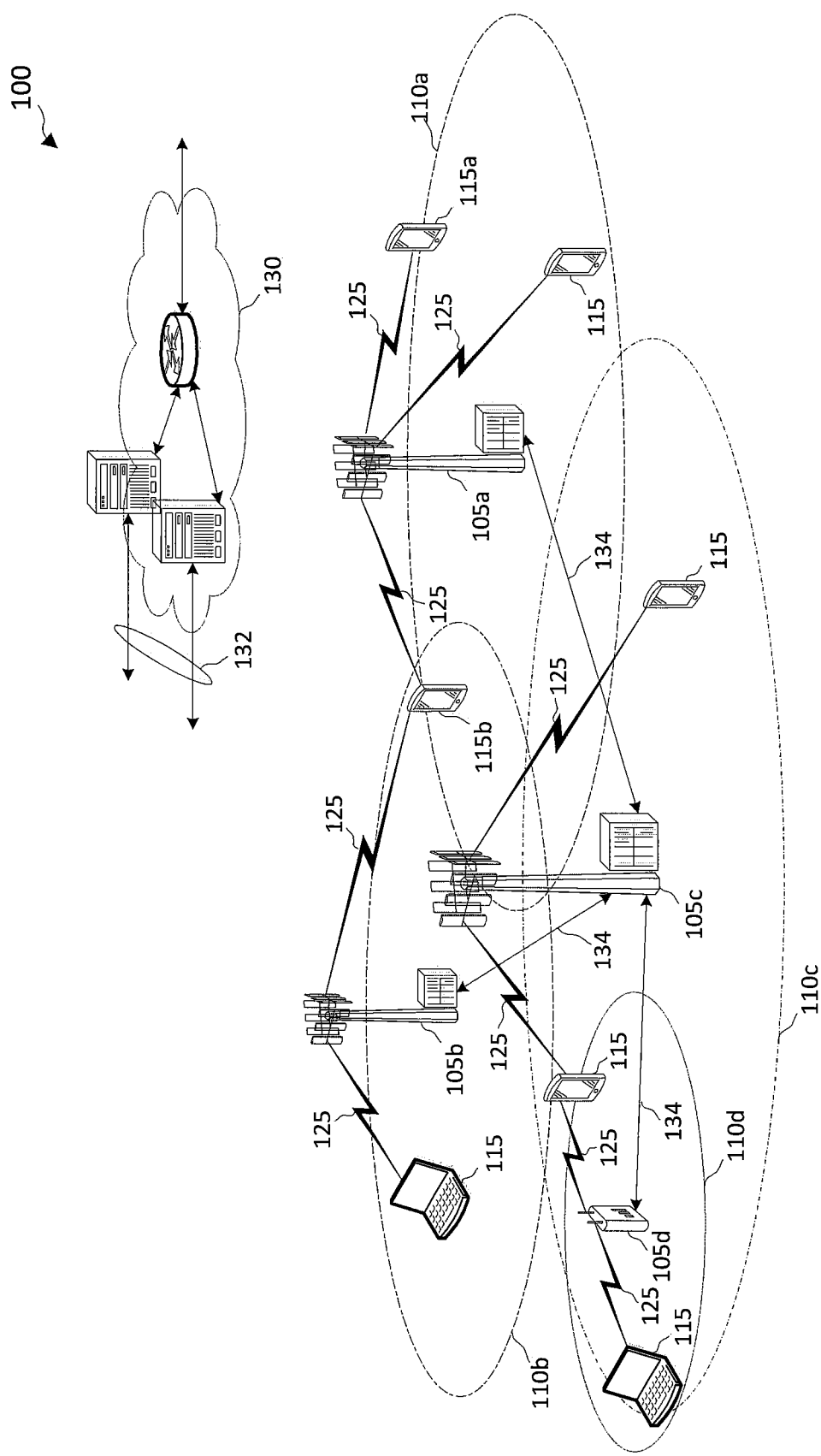
FIG. 1 illustrates an exemplary wireless communication network according to embodiments of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as code-division multiple access (CDMA), time-division multiple access (TDMA), frequency-division multiple access (FDMA), orthogonal frequency-division multiple access (OFDMA), single-carrier 1-DMA (SC-FDMA) and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the wireless networks and radio technologies mentioned above as well as other wireless networks and radio technologies, such as a next generation (e.g., $5^{th}$ Generation (5G) operating in mmWave bands) network.

Embodiments of the present disclosure describe mechanisms, systems and techniques to reduce the power consumption and/or latency associated with the transmission and receipt of master information blocks by modifying how the bit field for an MIB is arranged for transmission as well as when the MIB at the receiving end is decoded.

In some examples, MIBs associated with a physical broadcast channel (PBCH) are periodically (e.g., intermittently or continuously) transmitted from a base station (BS) to a user equipment (UE) associated with the physical broadcast channel to keep the user equipment synchronized with the base station. According to embodiments of the present disclosure, polar coding may be used for encoding the master information block. In some examples, before transmission the fields of the master information blocks may be divided into two groups of fields. The first group of fields may include those fields determined to change more frequently than the second group of fields, e.g. from one period to the next. The second group of fields may change less frequently than the first group of fields, e.g. not change from one period to the next such as for several periods. In some examples, each field may include one or more bits of data.

Since the base station may use polar coding to encode the master information block (which is then transmitted to a user equipment), the user equipment may use polar decoding to retrieve the master information block. According to embodiments of the present disclosure, the user equipment does not decode every master information block it receives. Instead, the user equipment may compute a log-likelihood ratio (LLR) of the second group of fields and compare the LLR against a threshold (e.g., an angle threshold corresponding to an angle between two vectors). If the LLR value is less than the threshold, the user equipment determines not to decode the master information block (i.e., on the conclusion that the data contained in the second group of fields has not changed from the last period it was decoded). If, on the other hand, the LLR value is greater than the threshold, the user equipment determines to continue with decoding the master information block (i.e., on the conclusion that the data contained in the second group of fields has changed from the last period it was decoded).

In alternative embodiments of the present disclosure, polar encoding may generate codewords that may be divided by codeword bit indices into two groups of fields, a first group of fields that may be encoded based on the all of the fields of the master information block and a second group of fields that may be encoded based on a subset of the fields of the master information block. In some examples, the second group of fields of the master information block that may not change from one period to the next is assigned to the subset of the fields such that the second group of fields of the master information block may generate the second group of fields of the encoded master information block. As such, the second group of fields of the encoded master information block may not change from one time period to the next and may not even change for several time periods.

Aspects of the present disclosure provide several benefits. For example, the polar coding waveform design according to aspects of the present disclosure (including the arrangement of the bit field for the MIB to arrange bits that frequently change into a first group of fields and bits that do not frequently change into a second group of fields, as well as in embodiments including that codewords from the second group of fields do not depend on any bits or codewords from the first group of fields) enables a receiving user equipment to decode less than all of the received MIBs. For example, an additional benefit at a receiving user equipment is a reduction in latency and/or power consumption. This is because, according to embodiments of the present disclosure, the result of the UE's comparison with the LLRs may result in the UE not decoding every MIB received (i.e., when the LLR comparison identifies a second group of fields in a received MIB as not having changed from that received/decoded in a previous period). This results in a more efficient decoding of PBCH polar code waveforms in NR networks, which in turn reduces the "cost" of accessing the information encoded in the PBCH waveforms.

This enables an NR network to share or reuse LTE resources in an LTE component carrier or frequency band. For example, an NR network may operate over an NR frequency band paired with one or more LTE UL frequency bands. A BS of the NR network may broadcast system information including a random access configuration. The random access configuration may indicate resources for performing a random access procedure to gain initial access to the NR network. The random access resources may be in one of the LTE UL frequency bands. To gain initial access to the NR network, a UE may transmit a random access request (e.g., a random access preamble signal) in the LTE UL frequency band and the BS may respond by transmitting a random access response in the NR frequency band. Subsequently, the UE may transmit a connection request in the LTE UL frequency band to establish a connection with the BS. The BS may respond by transmitting a connection response in the NR frequency band. After establishing a connection, the BS may reconfigure the UE to use the NR frequency band for UL communications or configure the UE to continue to use the LTE UL frequency band for UL communications. In some embodiments, the NR BS may negotiate or coordinate with the LTE networks to gain access to the LTE UL frequency bands.

FIG. 1 illustrates a wireless communication network 100 according to embodiments of the present disclosure. The network 100 includes BSs 105, UEs 115, and a core network 130. The network 100 may be a cellular network or a non-cellular wireless network. For example, the network 100 may be a LTE network, a LTE-A network, a millimeter wave (mmW) network, a new radio (NR) network, a 5G network, or any other successor network to LTE. Alternatively, the network 100 may be a unified network supporting multiple radio access technologies (RATs), such as both LTE and NR. A BS 105 may be a station that communicates with the UEs 115 and may also be referred to as a base transceiver station, a node B, an Evolved Node B (eNodeB or eNB) or a next Generation Node B (gNB), an access point, and the like.

The BSs 105 may wirelessly communicate with the UEs 115 via one or more BS antennas. Each BS 105 may provide communication coverage for a respective geographic coverage area 110. In 3GPP, the term "cell" can refer to this particular geographic coverage area of a BS and/or a BS subsystem serving the coverage area, depending on the context in which the term is used. In this regard, a BS 105 may provide communication coverage for a macro cell, a pico cell, a femto cell, and/or other types of cell. A macro cell generally covers a relatively large geographic area (e.g., several kilometers in radius) and may allow unrestricted access by UEs with service subscriptions with the network provider. A pico cell may generally cover a relatively smaller geographic area and may allow unrestricted access by UEs with service subscriptions with the network provider. A femto cell may also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like).

A BS for a macro cell may be referred to as a macro BS. A BS for a pico cell may be referred to as a pico BS. A BS for a femto cell may be referred to as a femto BS or a home BS. In the example shown in FIG. 1, the BSs 105a, 105b and 105c are examples of macro BSs for the coverage areas 110a, 110b and 110c, respectively. The BSs 105d is an example of a pico BS or a femto BS for the coverage area 110d. As will be recognized, a BS 105 may support one or multiple (e.g., two, three, four, and the like) cells.

Communication links 125 shown in the network 100 may include uplink (UL) transmissions from a UE 115 to a BS 105, or downlink (DL) transmissions, from a BS 105 to a UE 115. The UEs 115 may be dispersed throughout the network 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

The BSs 105 may communicate with the core network 130 and with one another. The core network 130 may provide user authentication, access authorization, tracking, Internet Protocol (IP) connectivity, and other access, routing, or mobility functions. At least some of the BSs 105 (e.g., which may be an example of an eNB or an access node controller (ANC)) may interface with the core network 130 through backhaul links 132 (e.g., S1, S2, etc.) and may perform radio configuration and scheduling for communication with the UEs 115. In various examples, the BSs 105 may communicate, either directly or indirectly (e.g., through core network 130), with each other over backhaul links 134 (e.g., X1, X2, etc.), which may be wired or wireless communication links.

Each BS 105 may also communicate with a number of UEs 115 through a number of other BSs 105, where the BS 105 may be an example of a smart radio head. In alternative configurations, various functions of each BS 105 may be distributed across various BSs 105 (e.g., radio heads and ANCs) or consolidated into a single BS 105.

In some implementations, the network 100 utilizes orthogonal frequency division multiplexing (OFDM) on the downlink and single-carrier frequency division multiplexing (SC-1-DM) on the UL. OFDM and SC-1-DM partition the system bandwidth into multiple (K) orthogonal subcarriers, which are also commonly referred to as tones, bins, or the like. Each subcarrier may be modulated with data. In general, modulation symbols are sent in the frequency domain with OFDM and in the time domain with SC-1-DM. The spacing between adjacent subcarriers may be fixed, and the total number of subcarriers (K) may be dependent on the system bandwidth. The system bandwidth may also be partitioned into subbands.

In an embodiment, the BSs 105 may assign or schedule transmission resources (e.g., in the form of time-frequency resource blocks) for DL and UL transmissions in the network 100. DL refers to the transmission direction from a BS 105 to a UE 115, whereas UL refers to the transmission direction from a UE 115 to a BS 105. The communication may be in the form of radio frames. A radio frame may be divided into a plurality of subframes, for example, about 10. Each subframe can be divided into slots, for example, about 2. In a frequency-division duplexing (FDD) mode, simultaneous UL and DL transmissions may occur in different frequency bands. For example, each subframe may include a UL subframe in a UL frequency band and a DL subframe in a DL frequency band. In a time-division duplexing (TDD) mode, UL and DL transmissions occur at different time periods using the same frequency band. For example, a subset of the subframes (e.g., DL subframes) in a radio frame may be used for DL transmissions and another subset of the subframes (e.g., UL subframes) in the radio frame may be used for UL transmissions.

The DL subframes and the UL subframes may be further divided into several regions. For example, each DL or UL subframe may have pre-defined regions for transmissions of reference signals, control information, and data. Reference signals are predetermined signals that facilitate the communications between the BSs 105 and the UEs 115. For example, a reference signal may have a particular pilot pattern or structure, where pilot tones may span across an operational bandwidth or frequency band, each positioned at a pre-defined time and a pre-defined frequency. For example, a BS 105 may transmit cell-specific reference signals (CRSs) and/or channel state information-reference signals (CSI-RSs) to enable a UE 115 to estimate a DL channel. Similarly, a UE 115 may transmit sounding reference signals (SRSs) to enable a BS 105 to estimate a UL channel. Control information may include resource assignments and protocol controls. Data may include protocol data and/or operational data. In some embodiments, the BSs 105 and the UEs 115 may communicate using self-contained subframes. A self-contained subframe may include a portion for DL communication and a portion for UL communication. A self-contained subframe may be DL-centric or UL-centric. A DL-centric subframe may include a longer duration for DL communication the UL communication. A UL-centric subframe may include a longer duration for UL communication the UL communication.

In an embodiment, a UE 115 attempting to access the network 100 may perform an initial cell search by detecting a primary synchronization signal (PSS) from a BS 105. The PSS may enable synchronization of period timing and may indicate a physical layer identity value. The UE 115 may then receive a secondary synchronization signal (SSS). The SSS may enable radio frame synchronization, and may provide a cell identity value, which may be combined with the physical layer identity value to identify the cell. The SSS may also enable detection of a duplexing mode and a cyclic prefix length. Some systems, such as TDD systems, may transmit an SSS but not a PSS. Both the PSS and the SSS may be located in a central portion of a carrier, respectively.

After receiving the PSS and SSS, the UE 115 may receive a master information block (MIB), which may be transmitted in the physical broadcast channel (PBCH). The MIB may contain system bandwidth information, a system frame number (SFN), and a Physical Hybrid-ARQ Indicator Channel (PHICH) configuration. After decoding the MIB, the UE 115 may receive one or more system information blocks (SIBs). For example, SIB1 may contain cell access parameters and scheduling information for other SIBs. Decoding SIB1 may enable the UE 115 to receive SIB2. SIB2 may contain radio resource configuration (RRC) configuration information related to random access channel (RACH) procedures, paging, physical uplink control channel (PUCCH), physical uplink shared channel (PUSCH), power control, SRS, and cell barring. After obtaining the MIB and/or the SIBs, the UE 115 may perform random access procedures to establish a connection with the BS 105. After establishing the connection, the UE 115 and the BS 105 may enter a normal operation stage, where operational data may be exchanged.

In some embodiments, the network 100 may be a unified network supporting both LTE and NR. In such embodiments, the network 100 may operate over an LTE spectrum or LTE component carriers and an NR spectrum or NR component carriers. The LTE spectrum may include low-frequency bands that are below 1 GHz and mid-frequency bands that are between about 1 GHz to about 3 GHz. The NR spectrum may include sub-6 GHz frequency bands and millimeter wave bands. The BSs 105 may include LTE BSs and NR BSs. In some embodiments, LTE BSs and NR BSs may be co-located. For example, the BSs 105 may employ the same hardware to implement both LTE and NR by executing different software components or stacks for LTE and NR. In addition, the UEs 115 may include standalone LTE devices and standalone NR devices. Standalone LTE devices may support LTE connectivity, but not NR. Conversely, standalone NR devices may support NR connectivity, but not LTE. Alternatively, some UEs 115 may support dual LTE-NR connectivity. The communication mechanisms and frequency band plans for the various combinations of connectivity are described in greater detail herein.

Figure 2:
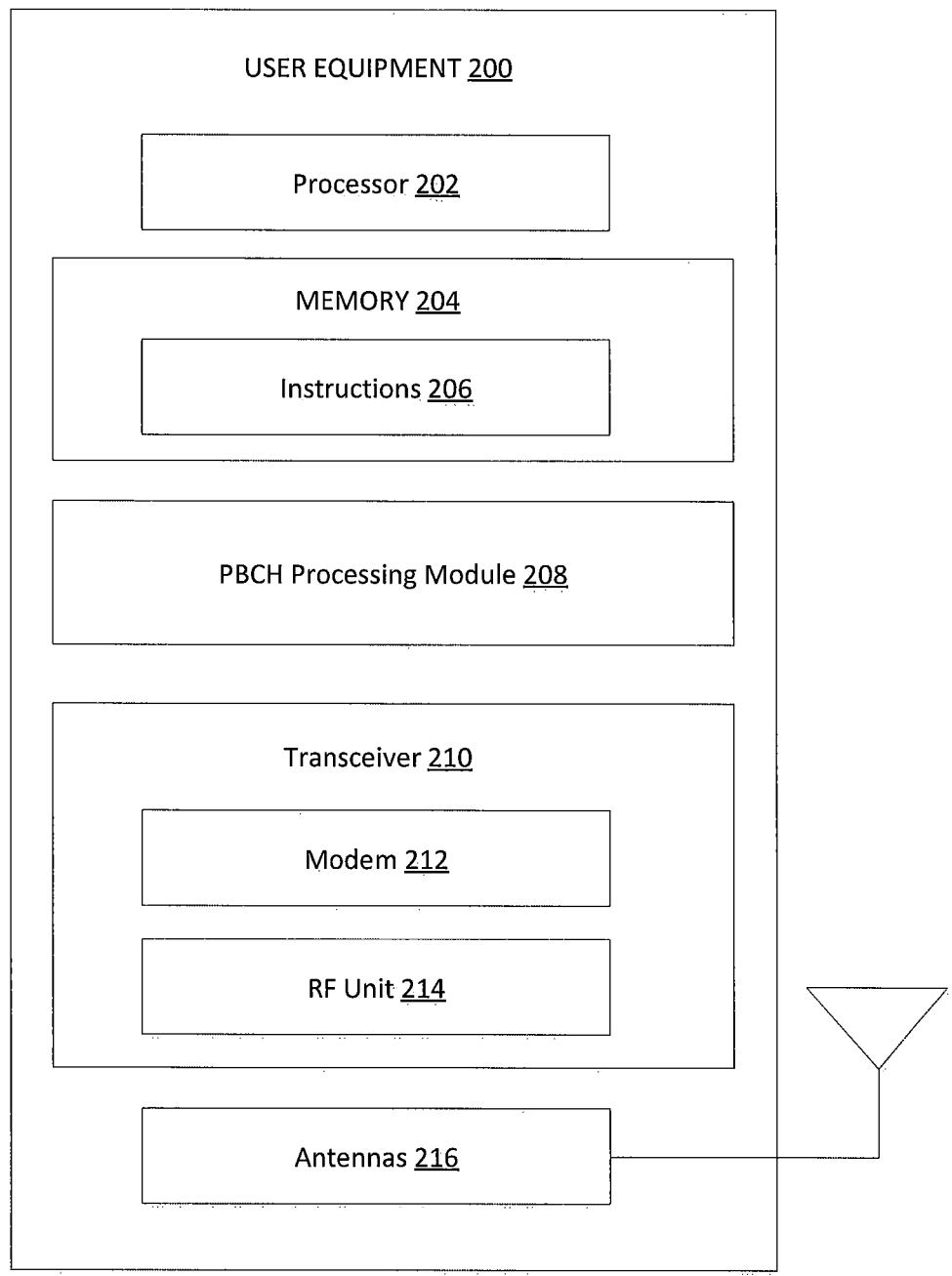
FIG. 2 is a block diagram of an exemplary user equipment (UE) according to embodiments of the present disclosure.

FIG. 2 is a block diagram of an exemplary wireless communication device 200, e.g., a UE 200, according to embodiments of the present disclosure. The UE 200 may be a UE 115 as discussed above. As shown, the UE 200 may include a processor 202, a memory 204, a PBCH processing module 208, a transceiver 210 including a modem subsystem 212 and a radio frequency (RF) unit 214, and an antenna 216. These elements may be in direct or indirect communication with each other, for example via one or more buses.

The processor 202 may include a central processing unit (CPU), a digital signal processor (DSP), an application-specific integrated circuit (ASIC), a controller, a field programmable gate array (FPGA) device, another hardware device, a firmware device, or any combination thereof configured to perform the operations described herein. The processor 202 may also be implemented as a combination of computing devices, e.g., a combination of a DSP and a microprocessor, a plurality of microprocessors, one or more microprocessors in conjunction with a DSP core, or any other such configuration.

The memory 204 may include a cache memory (e.g., a cache memory of the processor 202), random access memory (RAM), magnetoresistive RAM (MRAM), read-only memory (ROM), programmable read-only memory (PROM), erasable programmable read only memory (EPROM), electrically erasable programmable read only memory (EEPROM), flash memory, solid state memory device, hard disk drives, other forms of volatile and non-volatile memory, or a combination of different types of memory. In some embodiments, the memory 204 includes a non-transitory computer-readable medium. The memory 204 may store instructions 206. The instructions 206 may include instructions that, when executed by the processor 202, cause the processor 202 to perform the operations described herein with reference to the UEs 115 in connection with embodiments of the present disclosure. Instructions 206 may also be referred to as code. The terms "instructions" and "code" may include any type of computer-readable statement(s). For example, the terms "instructions" and "code" may refer to one or more programs, routines, subroutines, functions, procedures, etc. "Instructions" and "code" may include a single computer-readable statement or many computer-readable statements.

The PBCH processing module 208 may be used for various aspects of the present disclosure. For example, the PBCH processing module 208 is configured to listen to, e.g., monitor, the network for an information block broadcast. The PBCH processing module 208 is further configured to decode an information block, a system information block or a master information block, received by the transceiver 210 from the network, e.g., the NR network.

For example, the PBCH processing module 208 may improve the efficiency of decoding the information blocks received according to embodiments of the present disclosure. In particular, the PBCH processing module 208 may be configured to recognize information blocks that have been encoded with Polar coding with a first group of fields with data that changes more frequently than data in a second group of fields, as arranged by the transmitting BS 105.

When an information block, e.g. an MIB, is received from a transmitting BS 105, the PBCH processing module 208 may perform a correlation of the second group of fields of the received information block with a corresponding second group of fields from an earlier information block received from the BS 105. In some embodiments, this correlation is in the form of a log-likelihood ratio (LLR). The second group of fields may be in the form of a vector, and the earlier group of fields may be a vector as well with the same length (i.e., each vector is of the same length). The LLR is a "cheaper" operation for the UE (uses less computational resources) than decoding a Polar-coded information block.

The PBCH processing module 208 may be further configured to compare the result from the correlation, such as a normalized correlation coefficient determined from the LLRs of the compared fields to a threshold. The threshold may be chosen based on a desired level of aggression or conservatism—for example, a more aggressive threshold may allow more determinations of being below the threshold, such that the information block is not fully decoded, while a more conservative threshold may find more frequently that the blocks are different, resulting in decoding the information block. If the result is below the threshold, then the PBCH processing module 208 may determine that the codewords of the group of fields (the second group that changes less frequently than the first group of fields) are likely the same and the information block is not decoded. Moreover, the data in the first group of fields that changes more frequently than that in the second group may include deterministic data, such that the UE 200 may still be able to derive the values for that first group even where (i) one or more values of data in the first group has changed; and (ii) the PBCH processing module 208 has determined not to decode the information block due to the second group not having changed.

If, instead, the result from the correlation is below the threshold, the UE 200 may continue with decoding the information block (e.g., by Polar decoding on a Polar-encoded information block). The decoded information block may be used by the processor 202 to perform initialization and synchronization. In some examples, the PBCH processing module 208 may be implemented by the processor 202. Additional details regarding the correlation, comparison, threshold, and determination aspects are discussed in more detail with respect to the additional figures below.

As shown, the transceiver 210 may include the modem subsystem 212 and the RF unit 214. The transceiver 210 may be configured to communicate bi-directionally with other devices, such as the BSs 105. The modem subsystem 212 may be configured to modulate and/or encode the data from the memory 204 and/or the PBCH processing module 208 according to a modulation and coding scheme (MCS), e.g., a low-density parity check (LDPC) coding scheme, a turbo coding scheme, a convolutional coding scheme, a digital beamforming scheme, etc. The RF unit 214 may be configured to process (e.g., perform analog to digital conversion or digital to analog conversion, etc.) modulated/encoded data from the modem subsystem 212 (on outbound transmissions) or of transmissions originating from another source such as a UE 115. The RF unit 214 may be further configured to perform analog beamforming in conjunction with the digital beamforming. Although shown as integrated together in transceiver 210, the modem subsystem 212 and the RF unit 214 may be separate devices that are coupled together at the UE 115 to enable the UE 115 to communicate with other devices.

The RF unit 214 may provide the modulated and/or processed data, e.g. data packets (or, more generally, data messages that may contain one or more data packets and other information), to the antenna 216 for transmission to one or more other devices. This may include, for example, transmission of channel reservation signals according to embodiments of the present disclosure. The antenna 216 may further receive data messages transmitted from other devices. This may include, for example, reception of channel reservation signals according to embodiments of the present disclosure. The antenna 216 may provide the received data messages for processing and/or demodulation at the transceiver 210. Although FIG. 2 illustrates antenna 216 as a single antenna, antenna 216 may include multiple antennas of similar or different designs in order to sustain multiple transmission links. The RF unit 214 may configure the antenna 216.

Figure 3:
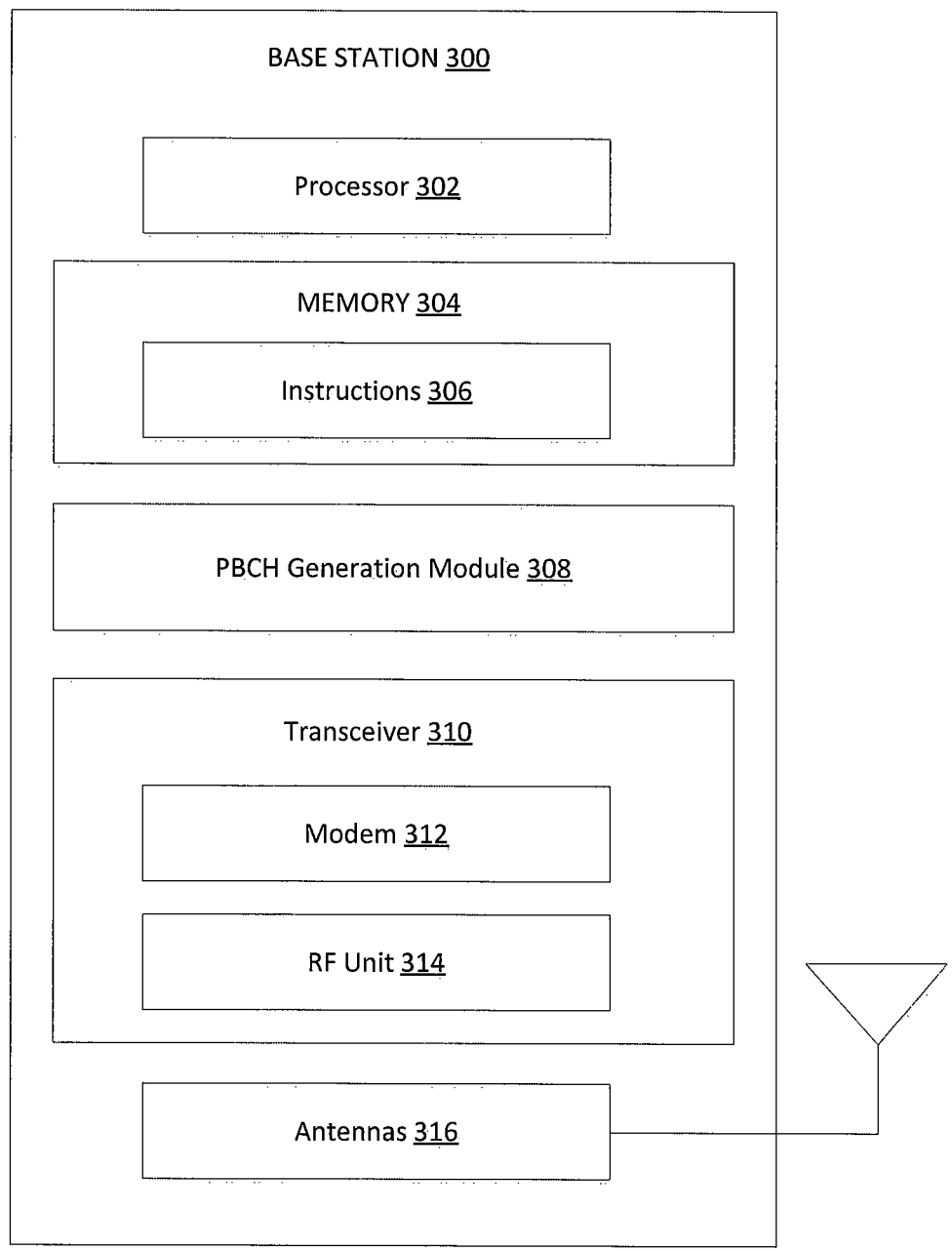
FIG. 3 is a block diagram of an exemplary base station (BS) according to embodiments of the present disclosure.

FIG. 3 is a block diagram of an exemplary BS 300 according to embodiments of the present disclosure. The BS 300 may be a BS 105 as discussed above. As shown, the BS 300 may include a processor 302, a memory 304, a PBCH generation module 308, a transceiver 310 including a modem subsystem 312 and a RF unit 314, and an antenna 316. These elements may be in direct or indirect communication with each other, for example via one or more buses.

The processor 302 may have various features as a specific-type processor. For example, these may include a CPU, a DSP, an ASIC, a controller, a FPGA device, another hardware device, a firmware device, or any combination thereof configured to perform the operations described herein. The processor 302 may also be implemented as a combination of computing devices, e.g., a combination of a DSP and a microprocessor, a plurality of microprocessors, one or more microprocessors in conjunction with a DSP core, or any other such configuration.

The memory 304 may include a cache memory (e.g., a cache memory of the processor 302), RAM, MRAM, ROM, PROM, EPROM, EEPROM, flash memory, a solid state memory device, one or more hard disk drives, memristor-based arrays, other forms of volatile and non-volatile memory, or a combination of different types of memory. In some embodiments, the memory 304 may include a non-transitory computer-readable medium. The memory 304 may store instructions 306. The instructions 306 may include instructions that, when executed by the processor 302, cause the processor 302 to perform operations described herein.

The PBCH generation module 308 may be used for various aspects of the present disclosure. For example, the PBCH generation module 308 is configured to generate information blocks that may be used by the UEs 115 (e.g., by the UEs 115 to synchronize with the network, e.g., an NR network). The PBCH generation module 308 may further encode the information blocks that may be sent by the transceiver 310 to the network.

According to embodiments of the present disclosure, the PBCH generation module 308 is configured to arrange a bit field for the information blocks (e.g., MIB) to arrange bits that frequently change into a first group of fields in the information block, and bits that do not frequently change into a second group of fields in the information block. The first group of fields may include, for example, values that frequently change (e.g., from one frame to another) such as system frame number (SFN), cyclic redundancy check (CRC) field, beam index, and/or other fields in any combination). The second group of fields may include, for example, values that infrequently change (if at all), such as system bandwidth information (i.e., downlink channel bandwidth), physical hybrid-ARQ indicator channel (PHICH) configuration, PHICH duration, PHICH resource, and/or other fields in any combination. This improves the efficiency of monitoring and/or decoding of the information blocks at the receiving end according to embodiments of the present disclosure.

In some examples, the PBCH generation module 308 may use polar coding to encode the information blocks. Information blocks may include system information blocks and master information blocks and are described with respect to FIG. 5 and encoding the information blocks are described with respect to FIGS. 6-9. In some examples, the PBCH generation module 308 may be implemented by the processor 302.

As shown, the transceiver 310 may include the modem subsystem 312 and the RF unit 314. The transceiver 310 may be configured to communicate bi-directionally with other devices, such as the UEs 115 and/or another core network element. The modem subsystem 312 may be configured to modulate and/or encode data according to a MCS, e.g., a LDPC coding scheme, a turbo coding scheme, a convolutional coding scheme, a polar coding scheme, a digital beamforming scheme, etc. The RF unit 314 may be configured to process (e.g., perform analog to digital conversion or digital to analog conversion, etc.) modulated/encoded data from the modem subsystem 312 (on outbound transmissions) or of transmissions originating from another source such as a UE 115. The RF unit 314 may be further configured to perform analog beamforming in conjunction with the digital beamforming. Although shown as integrated together in transceiver 310, the modem subsystem 312 and the RF unit 314 may be separate devices that are coupled together at the BS 105 to enable the BS 105 to communicate with other devices.

The RF unit 314 may provide the modulated and/or processed data, e.g. data packets (or, more generally, data messages that may contain one or more data packets and other information), to the antenna 316 for transmission to one or more other devices. This may include, for example, transmission of information, e.g. information blocks with the bit fields rearranged to complete attachment to a network and communication with a camped UE 115 according to embodiments of the present disclosure. The antenna 316 may further receive data messages transmitted from other devices and provide the received data messages for processing and/or demodulation at the transceiver 310. Although FIG. 3 illustrates antenna 316 as a single antenna, antenna 316 may include multiple antennas of similar or different designs in order to sustain multiple transmission links.

Figure 4:
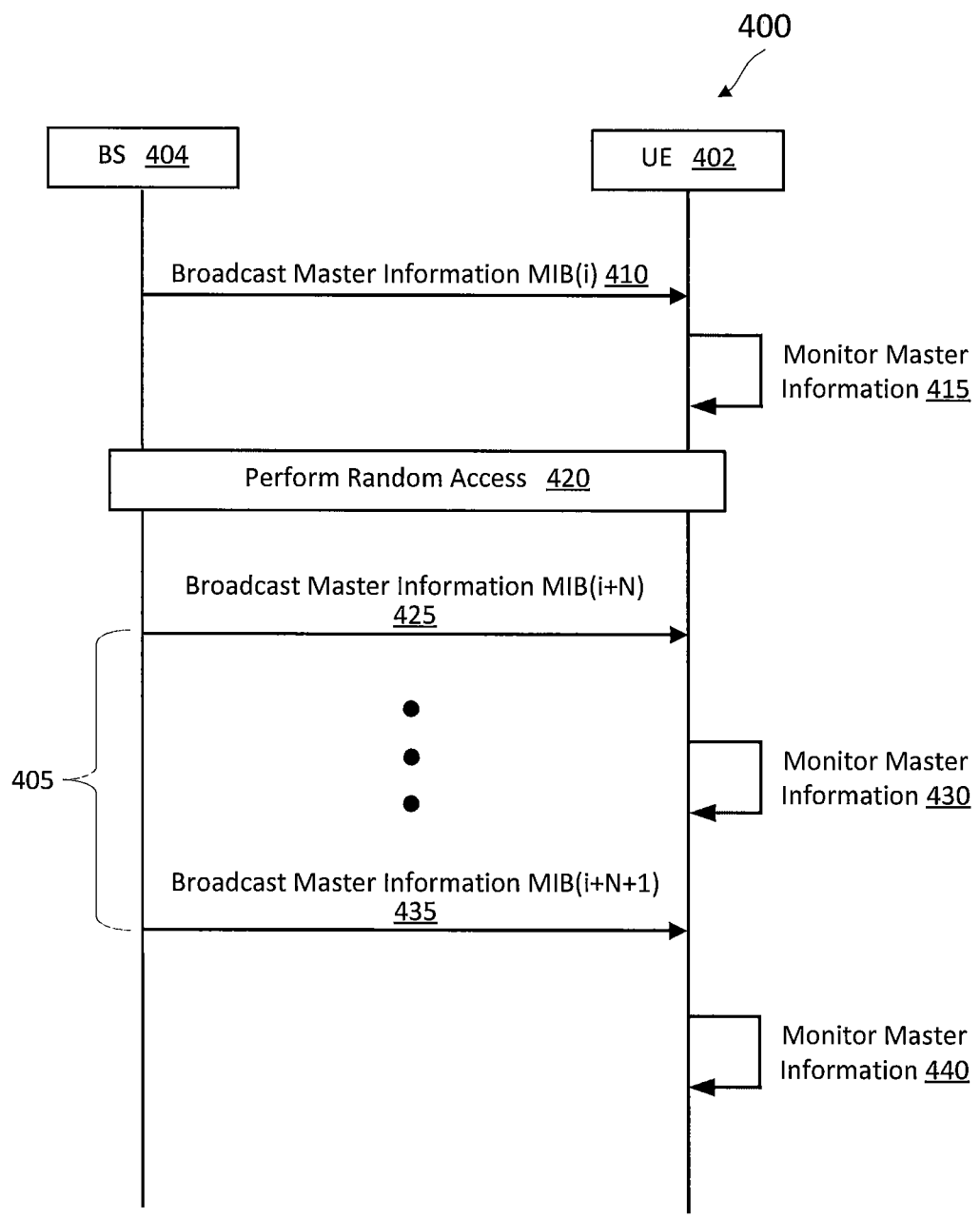
FIG. 4 illustrates a signaling diagram of an exemplary method for performing monitoring by an exemplary UE according to embodiments of the present disclosure.

FIG. 4 illustrates a signaling diagram 400 of a method for performing monitoring by an exemplary UE according to embodiments of the present disclosure. Actions of the method 400 may be executed by computing devices (e.g., a processor, processing circuit, and/or other suitable component) of wireless communication devices, such as UEs 115 and 200. As illustrated, the method 400 includes a number of enumerated actions, but embodiments of the method 400 may include additional actions before, after, and in between the enumerated actions. In some embodiments, one or more of the enumerated actions may be omitted or performed in a different order. The method 400 illustrates one NR BS and one standalone NR UE for purposes of simplicity of discussion, though it will be recognized that embodiments of the present disclosure may scale to many more UEs and/or BSs.

At action 410, UE 402 of an NR network (e.g., the network 100 of FIG. 1) receives at a time period (i), a master information block (MIB) (i), associated with the NR network broadcasted by BS 404. The master information block may include, for example, system bandwidth information, a system frame number (SFN), and Physical Hybrid-ARQ Indicator Channel (PHICH) configuration data. The master information block may also include an error-detecting code such as a cyclic redundancy check (CRC). In some examples, the master information block is encoded by the BS 404 and the received master information block is decoded by the UE 402. In some examples, the UE 402 may use a decoded information block to synchronize with the NR network.

At action 415, UE 402 of the NR network listens to the broadcasts from the BS 404. In some embodiments, BS 404 periodically broadcasts an updated master information block. For example, in a first time period (i), BS 404 broadcasts a first master information block and a period later which can be any time period, in a second time period (i+1), BS 404 broadcasts a second master information block different from the first master information block. In some examples, between the first and second time period, only the SFN and CRC parameters of the master information block may change (and/or other parameters, such as beam index). In some examples, each parameter of the master information block is one or more bits. According to embodiments of the present disclosure, each time that a subsequent information block (e.g., in this example master information block) is received, the UE 402 may compare the second group of fields (corresponding to those fields with data that changes infrequently as grouped by the BS 404 prior to encoding and transmission) of the newly received information block (in the second time period i+1) to the same group of fields from the prior period (earlier, time period i) to determine if they are different, as discussed above with respect to FIG. 2 and further with respect to subsequent figures below.

At action 420, after obtaining an MIB, the UE 402 may perform random access procedures to establish a connection with the BS 404 of the NR network. After establishing the connection, the UE 402 and the BS 404 may enter a normal operation stage, where operational data may be exchanged. In some examples, the normal operation includes BS 404 requesting data from UE 402 and the UE 402 responding to the request. In some examples, the normal operation 420 includes UE 402 requesting data from BS 404 and BS 404 responding to the request.

At action 425, in time period (i+N), UE 402 may receive an MIB(i+N) associated with the NR network that is broadcasted by BS 404. In some examples, UE 402 may use MIB(i+N) to re-synchronize with the NR network. Again, according to embodiments of the present disclosure, the UE 402 may compare the second group of fields with the MIB(i+N) to the corresponding group of fields with the MIB(i+N−1), or another MIB from a previous time period as appropriate, to determine if they are different, as discussed above with respect to FIG. 2 and further with respect to subsequent figures below.

At action 430, UE 402 of the NR network listens to the broadcasts from the BS 404. In some examples, BS 404 repeats the broadcast of a same master information block. For example, as show in the period 405 between the broadcast of the MIB(i+N) at action 425 occurring at the time period (i+N), BS 404 repeats the broadcast of the MIB(i+N) three times (as just one example).

At action 435, in the next time period (i+N+1), UE 402 may receive the MIB(i+N+1) associated with the NR network that is broadcasted by BS 404. Again, according to embodiments of the present disclosure, the UE 402 may compare the second group of fields with the MIB(i+N) to the corresponding group of fields with the MIB(i+N−1), or another MIB from a previous time period as appropriate, to determine if they are different, as discussed above with respect to FIG. 2 and further with respect to subsequent figures below.

At action 440, UE 402 of the NR network listens to the broadcasts from the BS 404, similar to the actions as discussed above.

Figure 5:
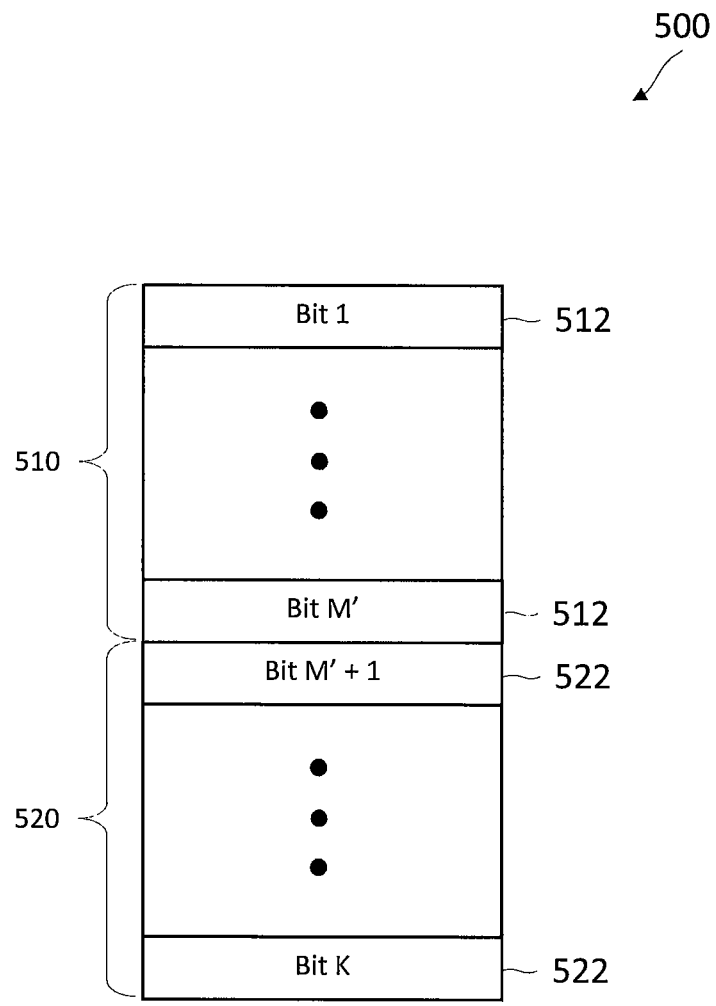
FIG. 5 is a block diagram of an exemplary bit structure of an exemplary master information block according to embodiments of the present disclosure.

FIG. 5 is a block diagram of a bit structure of an exemplary master information block 500 according to embodiments of the present disclosure. The exemplary structure illustrated in FIG. 5 may be applied more generally with information blocks, including system information blocks or master information blocks. The example below will discuss master information blocks for ease of illustration. FIG. 5 illustrates an arrangement of bits into sub-blocks of bits that frequently change and bits that do not frequently change.

In some examples, the master information block includes two sub-blocks 510 and 520 with a total of K bits. The first sub-block 510 may include M' bits 512 out of the K total bits, and the second sub-block 520 may include K−M' bits 522 out of the K total bits. The bits in the first sub-block may represent information (such as SFN, CRC, beam index, a reserved field 0, and/or other parameters) that changes more frequently, for example, from one time period to the next. Sub-block 510 is also described with respect to embodiments of the present disclosure as the first group of fields (of bits).

The bits in the second sub-block 520 may represent information (such as the cell basic physical layer parameters, SU-1 scheduling information, a reserve field 1, and/or other parameters) that change less frequently than the first sub-block and for example may not change from one time period to the next (for example, they may stay the same for several time periods). Sub-block 520 is also described with respect to embodiments of the present disclosure as the second group of fields (of bits). Thus, the bits 512 of the first sub-block 510 may change from one time period to the next and the bits 522 of the second sub-block 520 may stay the same from one time period to the next. As noted elsewhere, the master information block 500 may be arranged with sub-blocks 510, 520 by a BS (e.g., BS 105 of FIG. 1/BS 300 of FIG. 3).

Figure 6:
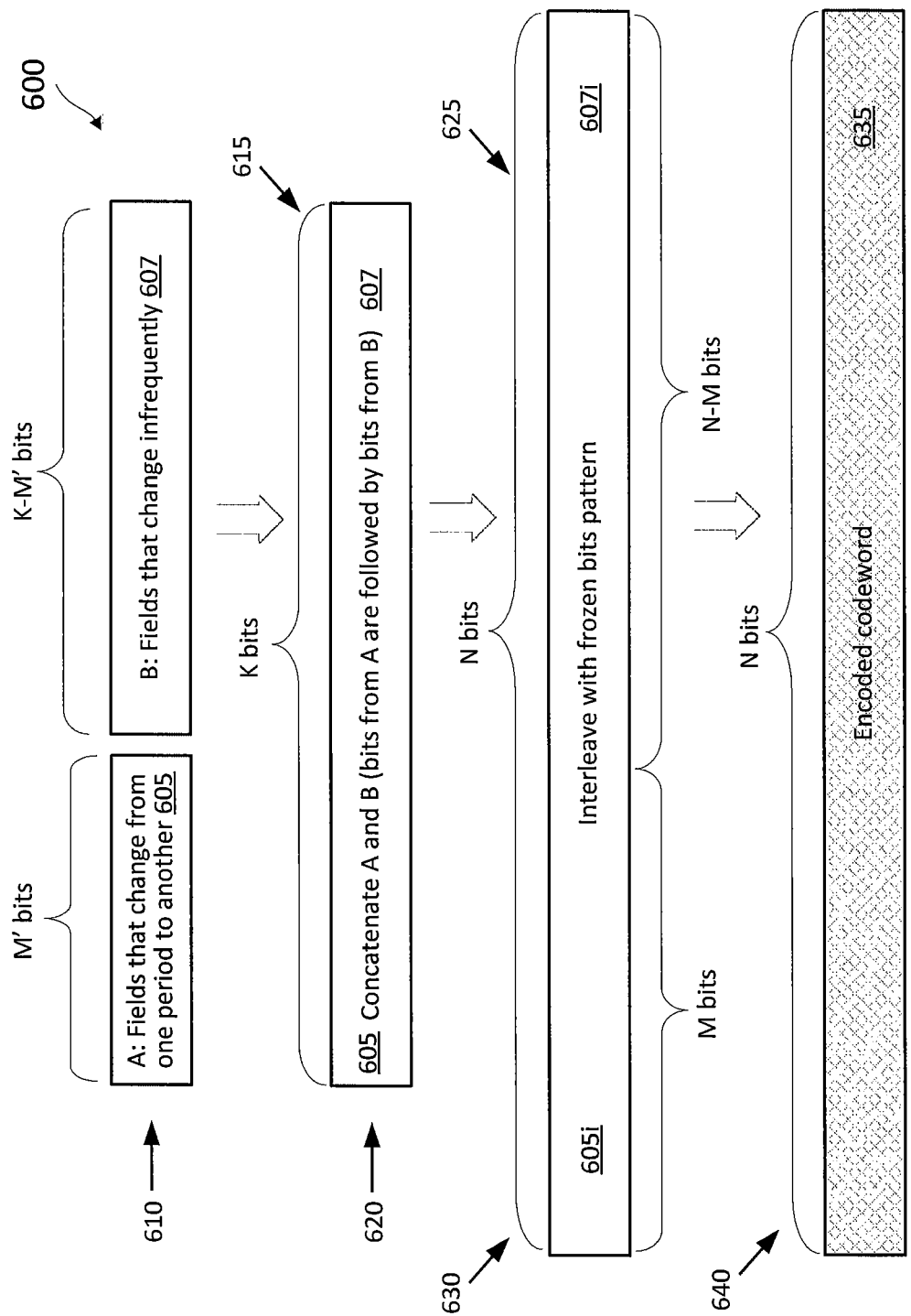
FIG. 6 is a block diagram of an exemplary procedure of encoding an information block according to embodiments of the present disclosure.

FIG. 6 is a block diagram of exemplary steps 600 of encoding an information block according to embodiments of the present disclosure. Steps of the method 600 may be executed by computing devices (e.g., a processor, processing circuit, and/or other suitable component) of wireless communication devices, such as BSs 105 and 300. As illustrated, the method 600 includes a number of enumerated steps, but embodiments of the method 600 may include additional steps before, after, and in between the enumerated steps. In some embodiments, one or more of the enumerated steps may be omitted or performed in a different order.

At step 610, the bit structure of a master information block is divided into two sub-blocks. A sub-block 605 includes M' bits associated with information that change more frequently and, for example change from a time period to the next, and a sub-block 607 includes K−M' bits associated with information that change less frequently than the sub-block 605 and for example may not change from one time period to the next (for example, they may stay the same for several time periods). For example, the sub-block 605 corresponds to the sub-block 510 and the sub-block 607 corresponds to the sub-block 520 discussed with respect to FIG. 5 above.

At step 620, the sub-blocks 605 and 607 are gathered together such that the master information block 615 may include a total of K information bits. For example, as illustrated, the bits of sub-block 607 are concatenated to the bits of sub-block 605. As a result, the bits are organized in such a way that the K−M' bits of sub-block 607 (associated with information that changes less frequently) are gathered together, following the sub-block of M' bits of sub-block 605 (associated with information that changes more frequently).

At step 630, the master information block 615 is interleaved with frozen bits (e.g., bits that are pre-arranged to be known by both the sender, BS 105, and receiver, UE 115), and interleaved block 625 of N bits is created. The frozen bits do not carry information may be set to a fixed value, e.g., zero. As shown in FIG. 6, both sub-blocks 605 and 607 are interleaved with frozen bits to generate both sub-blocks 605i and 607i, respectively. The sub-block 605 of M' bits, associated with information that changes more frequently, is interleaved with N−M' frozen bits to grow to M bits of sub-block 605i. Also, the sub-block 607 of K−M' bits associated with information that change less frequently than the sub-block 605 is interleaved with N−M'+K−M' frozen bits to grow to N−M bits of sub-block 607i. As shown, the N−M bits associated with information that change less frequently together with the corresponding frozen bits (sub-block 607i) are gathered together following the M bits associated with information that change more frequently together with the corresponding frozen bits (sub-block 605i).

At step 640, the interleaved block 625 is encoded and an encoded codeword 635 on N bits is created. In some examples, polar codes are used for encoding the interleaved block 625. In some examples, the K information bits of the sub-blocks 605 and 607 may be assigned to more reliable polar code channels (e.g., out of those available) and the frozen bits may be assigned to more unreliable polar code channels (out of those available). Performing the polar encoding is described with respect to FIGS. 7-9.

Figure 7:
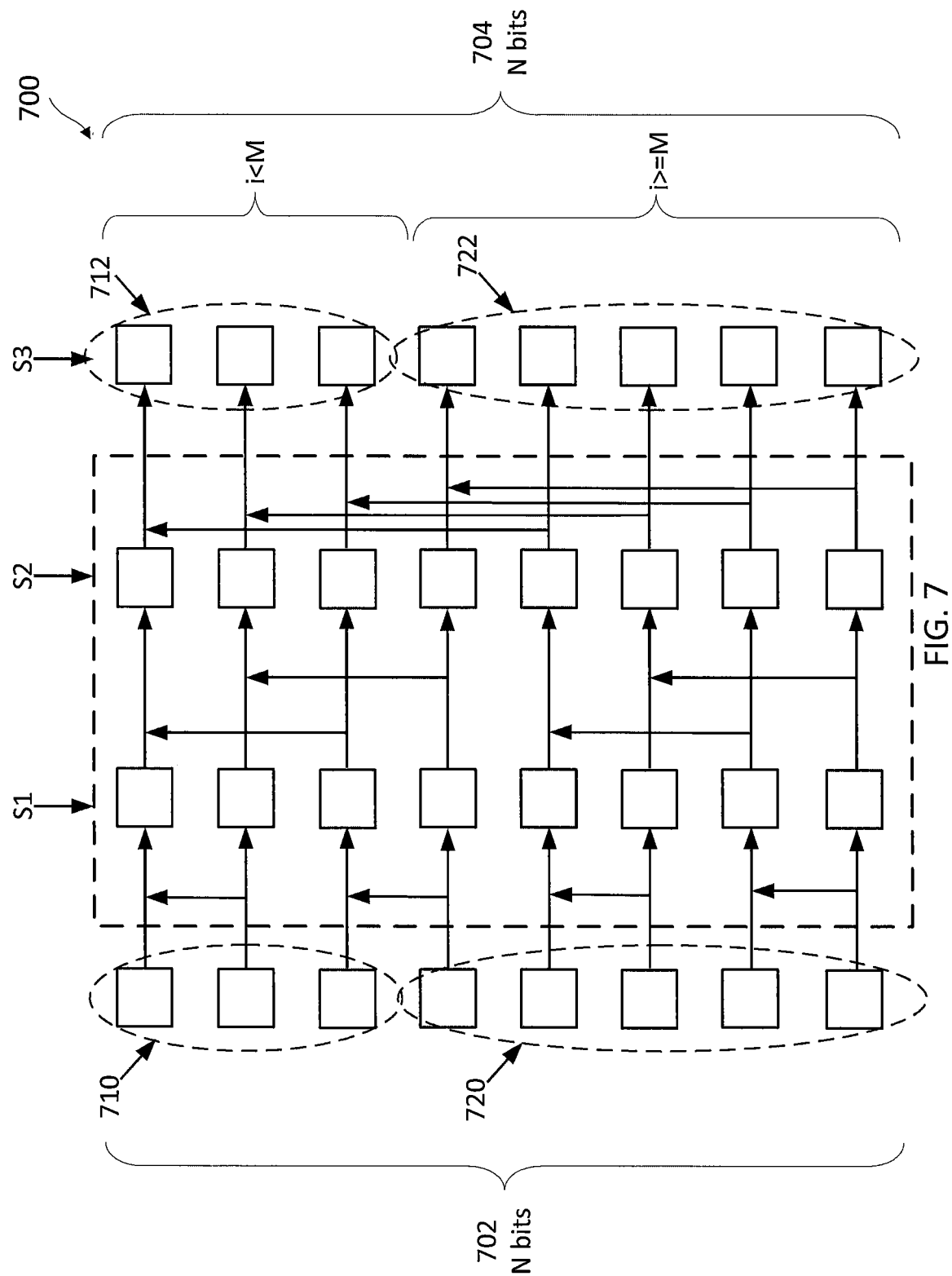
FIG. 7 is a block diagram of an exemplary system for polar encoding of a sequence in natural order according to embodiments of the present disclosure.

FIG. 7 is a block diagram of an exemplary system 700 for polar encoding of a sequence in natural order according to embodiments of the present disclosure. In some examples, as shown in FIG. 7, the encoding may be done in 3 stages illustrated as S1, S2, and S3. In some examples, the block of N bits 702 that includes the sub-blocks 710 and 720 (referring to the blocks in the first, left-most column of FIG. 7) is consistent with the interleaved block 625 of FIG. 6. As a result, sub-block 710 with M bits is consistent with the sub-block 605i with M bits and sub-block 720 with N−M is consistent with the sub-block 607i with N−M bits. Moreover, the block of N bits 704 that includes the sub-blocks 712 and 722 (referring to the blocks in the last, right-most column of FIG. 7) is consistent with the encoded codeword 635 of FIG. 6.

According to embodiments of the present disclosure, the stages S1, S2, and S3 are accomplished with operations that combine the values of the bits as illustrated with the arrows in FIG. 7. For example, the first bit of sub-block 710 in the upper-left corner of FIG. 7 may be combined with the second bit of sub-block 710 to generate a first value for the stage S1. The combination may be, for example, an exclusive-or (XOR) operation (generally referring to where an arrow intersects another line in FIG. 7, and likewise in FIGS. 8 and 9). The resulting value remains part of the first sub-block 710. The other bits from the sub-blocks are combined as illustrated with respective arrows in FIG. 7 to achieve stage S1.

The arrows from the information after stage S1, in the generation of the information at stage S2, are likewise combined with XOR operations in the order illustrated with the arrows in FIG. 7. For example, the information in the illustrated block at the top of the second column (identified as S1 in the figure) is XOR-ed with the information in the second illustrated block, the information in the second illustrated block is XOR-ed with the information in the first illustrated block of the second sub-block 720 (the fourth overall illustrated block of the S1 column), and so forth as illustrated for stage S2. This begins to introduce a dependence of the information in the first sub-block 710 on information in the second sub-block 720 (i.e., corresponding to information that changes less frequently).

From stage S2 to stage S3, the information in the blocks corresponding to the sub-block 710 (i.e., corresponding to information that changes more frequently than the information of sub-block 720) is combined (i.e., XOR-ed) with information from the second block of sub-block 720 (the $4^{th}$ block from the top in the third column from the left of FIG. 7). The resulting value remains part of the first sub-block 710 (i.e., corresponding to the bits whose information changes more frequently than those of the other sub-block 720) such that the values for the information that changes more frequently has a dependence on the information that changes less frequently from the other sub-block 720. The other bits from the sub-blocks are combined as illustrated with respective arrows in FIG. 7 to achieve the encoded information at stage S3.

More generally, as shown in FIG. 7, the system 700 is designed such that, at each stage (S1, S2, S3), the resulting sub-block 722 only depends on the sub-block 720, without dependence on information from sub-block 710. Thus, the sub-block 722 of the encoded codeword 704 only depends on information from the sub-block 720 consistent with the N–M bits of sub-block 607i of FIG. 6, corresponding to information that changes less frequently. As a result, the polar codes represented by the sub-block 722 change less frequently. Conversely, the sub-block 712 depends on information from both sub-blocks 710 and 720, consistent with the sub-blocks 605i and 607i of FIG. 6, and thus may change from one time period to next.

In some embodiments, as shown in FIG. 7, the sub-block 720 of fields that change infrequently may be arranged together such that only these fields generate the sub-block 722 of the polar codes. Thus, sub-block 722 of the polar codes changes infrequently as well.

Figure 8:
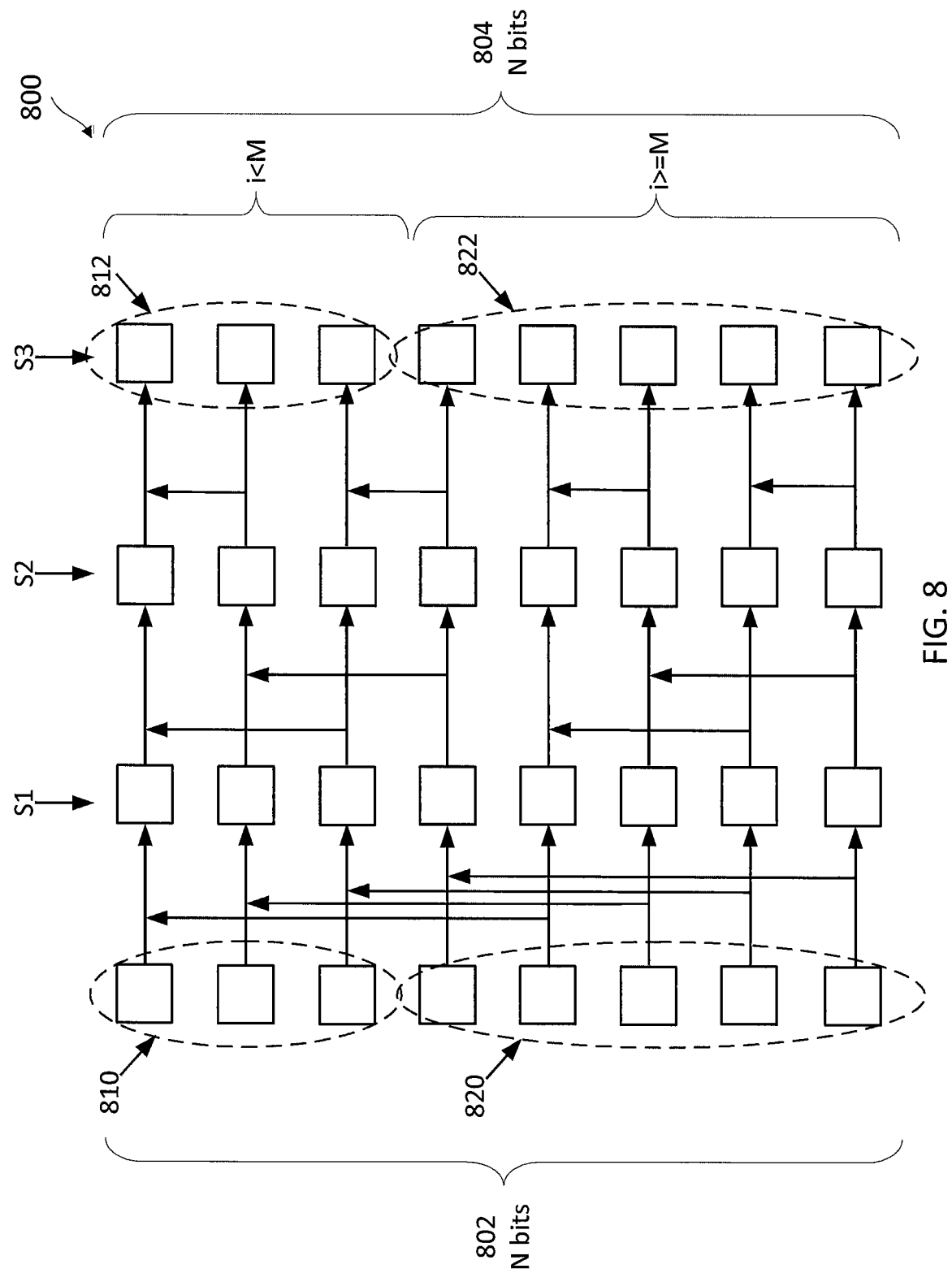
FIG. 8 is a block diagram of an exemplary system for polar encoding of a sequence in natural order according to embodiments of the present disclosure.

FIG. 8 is a block diagram of an exemplary system 800 for polar encoding of a sequence in natural order according to embodiments of the present disclosure. FIG. 8 illustrates an alternative embodiment to that illustrated in FIG. 7. Although the 3 stages of encoding of system 800 is different from the 3 stages of system 700, the encoded codeword 804 that results from the operations is the same as the encoded codeword 704 of FIG. 7. The encoded codeword in FIG. 8 includes the sub-block 822 of the encoded codeword 804, that only depends on the sub-block associated with information that changes less frequently (and, thus, the Polar-encoded data represented by the sub-block 822 change less frequently). Conversely, the sub-block 812 depend on both sub-blocks 810 and 820 (e.g., corresponding to 605i and 607i of FIG. 6, respectively), and thus may change from one time period to next.

In particular, the order of combining the bits/information in the various stages before obtaining the encoded codeword 804 differs from the combination approach illustrated in FIG. 7. The bits combined between the different bits of sub-blocks 810 and 820 (from the block of N bits 802 total) are combined differently for the first stage S1. For example, the first bit of sub-block 810 in the upper-left corner of FIG. 8 may be combined with the first bit of sub-block 820 (the $4^{th}$ block from the top in the left column) to generate a first value for the stage S1. The combination may be, for example, an exclusive-or (XOR) operation. The resulting value remains part of the first sub-block 810 (i.e., corresponding to the bits whose information changes more frequently than those of the other sub-block 820) such that the values for the information that changes more frequently has a dependence on the information that changes less frequently from the other sub-block 820. The other bits from the sub-blocks are combined as illustrated with respective arrows in FIG. 8.

The arrows from the information after stage S1, in the generation of the information at stage S2, are likewise combined with XOR operations in the order illustrated with the arrows in FIG. 8. For example, the information in the illustrated block at the top of the second column (identified as S1 in the figure) is XOR-ed with the information in the second illustrated block, the information in the second illustrated block is XOR-ed with the information in the first illustrated block of the second sub-block 820 (the fourth overall illustrated block of the S1 column), and so forth as illustrated.

Figure 9:
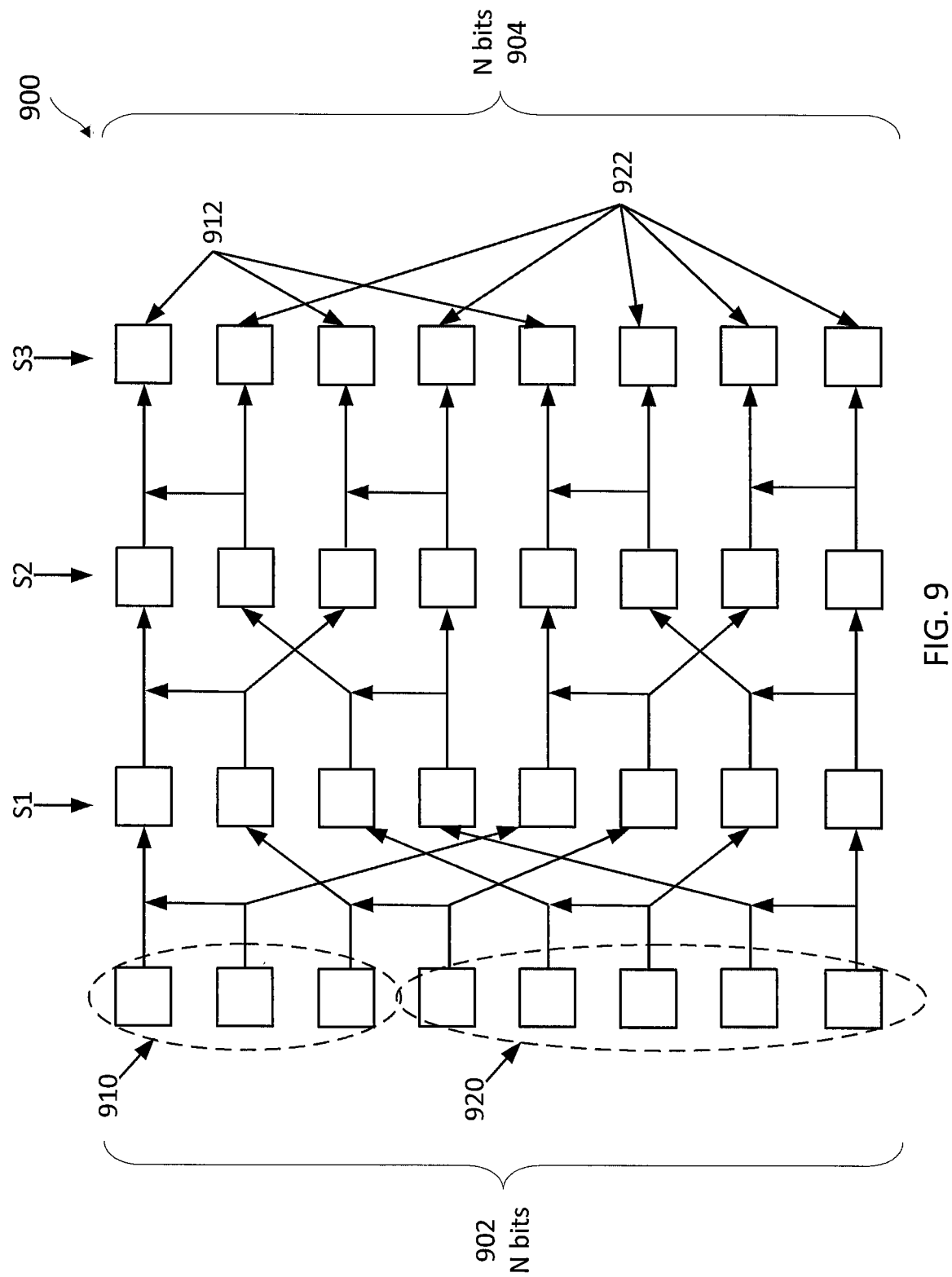
FIG. 9 is a block diagram of an exemplary system for polar encoding of a sequence in reverse order according to embodiments of the present disclosure.

FIG. 9 is a block diagram of an exemplary system 900 for polar encoding of a sequence in reverse order according to embodiments of the present disclosure. In some examples, encoding may be done in 3 stages S1, S2, and S3, for example analogous to the number of stages discussed with respect to FIGS. 7 and 8 above. The order in which the bits/information are combined differs in the example of FIG. 9 than that given for the natural order embodiments discussed above. It starts with a block of N bits 902 that includes the sub-blocks 910 and 920.

For example, as illustrated in FIG. 9 the first bit of sub-block 910 in the upper-left corner of FIG. 9 may be combined with the second bit of sub-block 910 to generate a first value for the stage S1. The combination may again be, for example, an exclusive-or (XOR) operation. The resulting value remains part of the first sub-block 910. However, the second bit of sub-block 910 does not carry forward to stage S1 in the same order in the column, as illustrated appearing as the $5^{th}$ block from the top in the second column corresponding to stage S1. The other bits from the sub-blocks are combined as illustrated with respective arrows in FIG. 9 to achieve stage S1.

The information of the different blocks of stage S1 are combined as illustrated to achieve the information of the blocks of stage S2 as further illustrated in FIG. 9. In particular, the order in which the information is combined according to the embodiment of FIG. 9 results in combinations (i.e., XOR) from stage S2 to S3 where the second information block of S2's column, shaded to identify information that originated from the bits of sub-block 920 for information that changes less frequently than the information from the bits of sub-block 910, is XOR-ed with the information with the first information block of S2's column.

The combinations continue from S2 to S3 as illustrated in FIG. 9 to achieve the encoded codeword 904.

The encoded codeword 904 includes the sub-set 922, which although not contiguous, only depends on the sub-block 920 of bits associated with information that changes less frequently. Thus, the polar codes represented by the sub-set 922 change less frequently. Conversely, the sub-set 912 depends on both the sub-blocks 605i and 607i of FIG. 6, and thus may change from one time period to next. The order identified in FIG. 9 may itself also be reversed, analogous to how the order in FIG. 8 reverses that illustrated in FIG. 7, with the same results (i.e., inputs and outputs) obtained.

In a decoding context, the receiving communication device (e.g., a UE) will typically follow a reverse order to that illustrated by the arrows in FIG. 9 (and, generally, in each of the FIGS. 7-9). In particular, when using the polar encoding sequence according to the embodiments of FIG. 9, the resulting encoded blocks in the stage S3 may be pair-wise analyzed (e.g., LLR calculated and compared with a threshold) without requiring that the entire codeword 904 have LLRs calculated and compared with thresholds. In other words, looking at the first two blocks at the top of the S3 column of FIG. 9, the LLR values may be determined for these blocks and, should they exceed relevant thresholds, the UE may progress to determining the values of the first two blocks in the S2 column without having to wait for the entire buffer for all of the codeword 904 to fill up first. This enables the UE to operate with a parallel pipeline structure, further improving the efficiency and speed of the decoding operation.

As shown in FIGS. 7-9, polar encoding is illustrated as being performed in 3 stages. In some examples, polar coding may be performed in 4, 5, 6, 7, or 8 stages and the polar codes at the last stage may include a first sub-block having information that more frequently changes than information in the second sub-block, according to embodiments of the present disclosure.

In some embodiments, a receiver such as the transceiver 210 from UE 200 of FIG. 2, may receive an encoded master information block. As shown with respect to FIG. 7 as an illustrative example, the encoded master information block may include a first sub-block 712 and a second sub-block 722. The first sub-block 712 may include information that more frequently changes than the second sub-block 722. In some examples, the receiver may receive a next encoded master information block. The next encoded master information block may also include a first sub-block 712 and a second sub-block 722 such that the first sub-block 712 may include information that more frequently changes than the second sub-block 722. The first sub-block and the second sub-block may be analogously described with respect to sub-blocks 812/912 and 822/922, respectively, of FIGS. 8 and 9. The UE 200 may then analyze this information as discussed above and below in more detail with respect to thresholds and actions taken therefrom.

Figure 10:
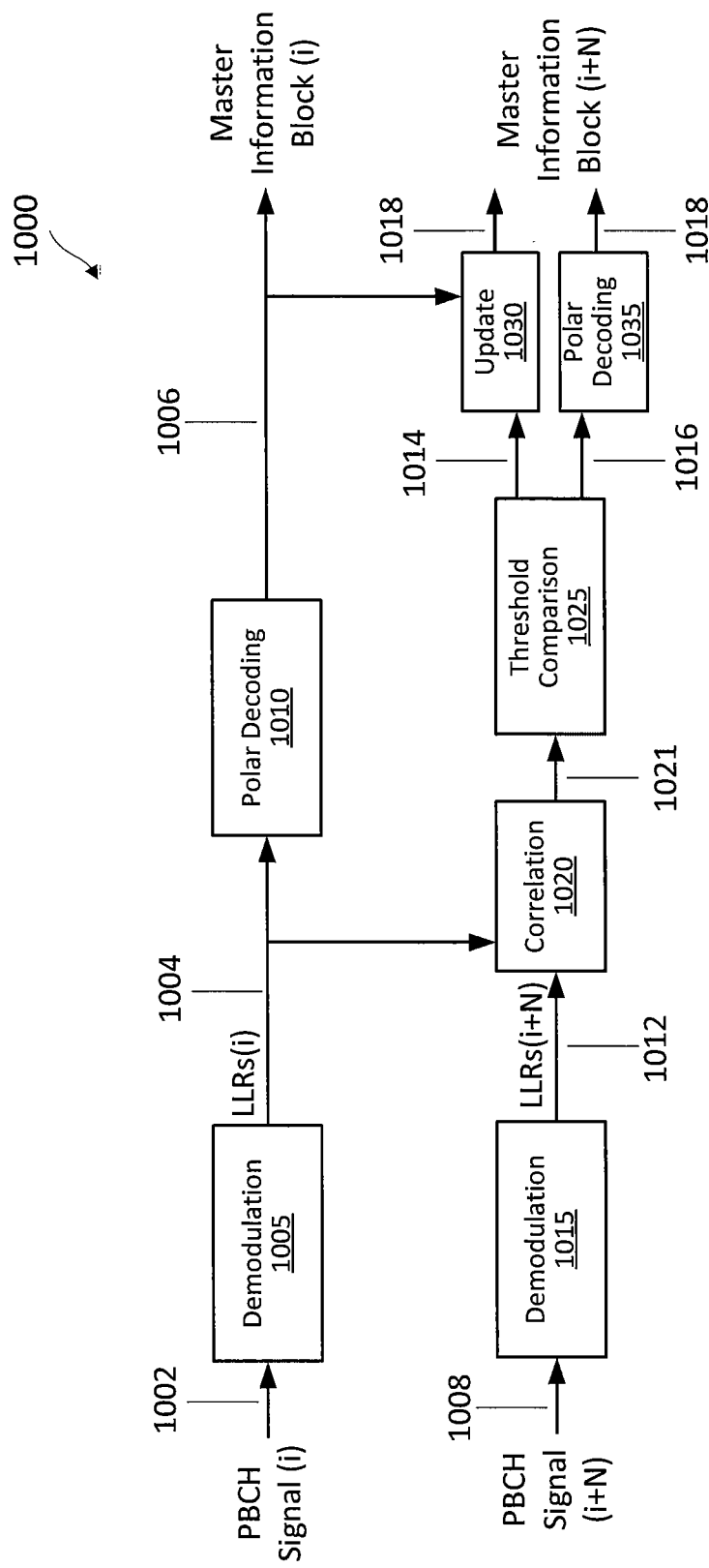
FIG. 10 is a block diagram of an exemplary system for decoding a master information block according to embodiments of the present disclosure.

FIG. 10 is a block diagram of an exemplary system 1000 for decoding a master information block (MIB) according to embodiments of the present disclosure. The system 1000 may be included in a UE, such as UEs 115 and 200. In some examples, the demodulation unit 1005, the polar decoding unit 1010, the correlation unit 1020, the threshold comparison unit 1025, the update unit 1030, and the polar decoding unit 1035 of the system 1000 are implemented by the processor 202 and/or PBCH processing module 208 of the UE 200 (FIG. 2).

The system 1000 includes a demodulation unit 1005 that may receive a PBCH signal 1002 in a time period (i), where the received PBCH signal 1002 may include an encoded MIB according to embodiments of the present disclosure (i.e., the bit field arranged with sub-blocks with more or less frequently changing information). The demodulation unit 1005 may demodulate the received PBCH signal 1002 and may generate an encoded MIB 1004, in a codeword that includes one or more bits associated with log-likelihood ratios (LLRs) of the encoded block.

The system 1000 further includes a polar decoding unit 1010 that may receive the encoded MIB 1004 to generate the MIB 1006 corresponding to time period (i). In some embodiments, the PBCH signal 1002 is transmitted by a BS, such as BSs 105 and 300, through a communication channel, e.g., a PBCH, and is received by a receiver such as the transceiver 210 of the UE 115/200. Thus, noise may be associated with the transmission and reception of the PBCH signal 1002 and thus the MIB 1006 may be an estimate of the MIB originally transmitted by the BS 105/300. The generated, i.e., estimated, MIB 1006 may be used by the UE to synchronize the UE at time period (i) with a network such as network 100 of FIG. 1. The polar decoding unit 1010 may remove the frozen bits when generating the MIB 1006.

At time period (i+N), where N is an integer equal to or greater than one, a demodulation unit 1015 that can be the same demodulation unit 1005 may receive another PBCH signal 1008. The received PBCH signal 1008 may include an encoded MIB associated with time period (i+N). The demodulation unit 1015 may demodulate the received PBCH signal 1008 and may generate the encoded MIB 1012 associated with time period (i+N) in a codeword.

At time period (i+N), the correlation unit 1020 may compare, e.g., correlate, the encoded MIB 1004 of time period (i) with the encoded MIB 1012 of time period (i+N) and may generate a matching value, e.g., comparison data 1021. As noted above each encoded information block such as the encoded MIBs 1004 and 1012 may include a first sub-block that more frequently changes than a second sub-block. In some examples, the correlation unit 1020 may compare the second sub-blocks of the encoded MIBs 1004 and 1012 (thus, not including the first sub-blocks) and may generate the comparison value based on comparing, e.g., correlating, the second sub-blocks associated with time period (i) and time period (i+N).

The comparison value may be determined a number of ways, including for example as a normalized correlation coefficient (NCC in EQ. 1 below). In this approach, each of the fields from the second sub-blocks is compared to each other from each time period (i, and i+N) to arrive at the normalized correlation coefficient. This is illustrated in Equation 1 as follows:

$$NCC_{i,j} \triangleq \frac{\sum_{i=0}^{i=N-1} X_i Y_i}{2\sqrt{\left(\sum_{i=0}^{i=N-1} (X_i)^2\right)\left(\sum_{i=0}^{i=N-1} (X_i)^2\right)}} \quad (1)$$

In the example of EQ. 1, the value i is the index in the codeword, N is the total length of the codeword, and X and Y are the LLRs for a given index in the codeword between the two time periods (e.g., X from time period i and Y from time period i+N). This is by way of example only. Whatever the approach, the correlation unit 1020 determines a comparison value (such as the NCC) for use as detailed below.

The comparison value is passed on to the threshold and comparison unit 1025, where the threshold and comparison unit 1025 may compare the comparison value with a predetermined threshold value. The threshold and comparison unit 1025 may decide a "match" exists between the second sub-blocks of the encoded MIBs 1004 and 1012 if the comparison value is less than the predetermined threshold value (i.e., as used here, a "match" refers to a determination that the differences between the vectors of the two sub-blocks are less than the threshold, indicating that the differences are likely due to noise perturbations in the transmission, not differences in the data itself). If the match exists, the output value 1014 of the comparison unit 1025 may indicate the match to the update unit 1030. The indication of the match may result in the UE determining to not fully decode any of the encoded MIB 1012, based on the determination that the information in the second sub-blocks has not changed. To still obtain the information from the first sub-block of the MIB 1012, which is more likely to have changed in the interval, the UE may calculate these values based on a knowledge of the deterministic nature of the data contained therein (e.g., SFN, beam index, and CRC).

In some examples, the threshold and comparison unit 1025 may determine that a match does not exist between the second sub-blocks of the encoded MIBs 1004 and 10012. The threshold and comparison unit 1025 may, in this situation, instead generate the output value 1016 to indicate lack of the match, and input the output value 1016 to the polar decoding unit 1035. Then the polar decoding unit 1035 may decode the entire encoded MIB 1012 to generate the MIB 1018 at time period (i+N).

A UE passing the synchronization phase may be required to continuously and repeatedly decode the PBCH signal in the idle state which may cause decoding latency, loss of efficiency, and power consumption, especially in URLLC and/or mMTC cases. As discussed, in a UE, generating the MIB 1018 at time period (i+N) from the encoded MIB 1012 may be accomplished by correlating the slow-changing portion (the "second sub-block") of FIGS. 5 and 6) and, if the correlation value is below a threshold, maintaining the same data from the previously-decoded second sub-block, and deterministically arriving at the information from the first sub-block based on known relationships over time. This approach results in saving power and improving latency of the UE.

As discussed, the transmission and reception of the PBCH signals involves noise and thus the predetermined threshold value of the threshold and comparison unit 1025 may be determined, e.g., calculated, based on determining the noise level of the transmission and the receiver. As a result, the threshold value may change both due to the determined noise level(s) and system objectives (e.g., a desired level of aggression or conservatism). For example, a more aggressive threshold value may allow more determinations of being below the threshold value, such that the information block is not fully decoded, while a more conservative threshold value may find more frequently that the blocks are different, resulting in decoding the information block.

In some embodiments, a receiver such as the transceiver 210 of FIG. 2, may receive a first encoded MIB 1002 that includes a first sub-block and a second sub-block such that the first sub-block may include information that more frequently changes than the second sub-block. In some examples, the receiver may receive a second encoded MIB 1008 that includes a third sub-block associated with the first sub-block and a fourth sub-block associated with the second sub-block such that the third sub-block may include information that more frequently changes than the fourth sub-block. In some embodiments, a correlation value between the second sub-block and the fourth sub-block is determined by the correlation unit 1020 of FIG. 10. In some embodiments, the fourth sub-block of the second encoded MIB 1012 is decoded based on the determining correlation, i.e. the value is found to be above the threshold value. In some examples, the third sub-block may include a system frame number (SFN) and a cyclic-redundancy check (CRC) among other parameters. The decoding may be performed by the polar decoding unit 1035 of FIG. 11.

In some embodiments, receiving the first encoded information block 1002 may include receiving the first encoded information block 1002 from a physical broadcast channel during a first time period (i). Receiving the second encoded information block 1008 may include receiving the second encoded information block 1008 from the physical broadcast channel during a second time period (i+N) after the first time period. In some embodiments, the first encoded information block 1002 and the second encoded information block 1008 are encoded based on a polar code. As shown with respect to FIG. 6-9, the second sub-block may follow the first sub-block in the first encoded information block 1002 and the fourth sub-block may follow the third sub-block in the second encoded information block 1008. In some examples, the first encoded information block and the second encoded information block are jointly encoded.

Figure 11:
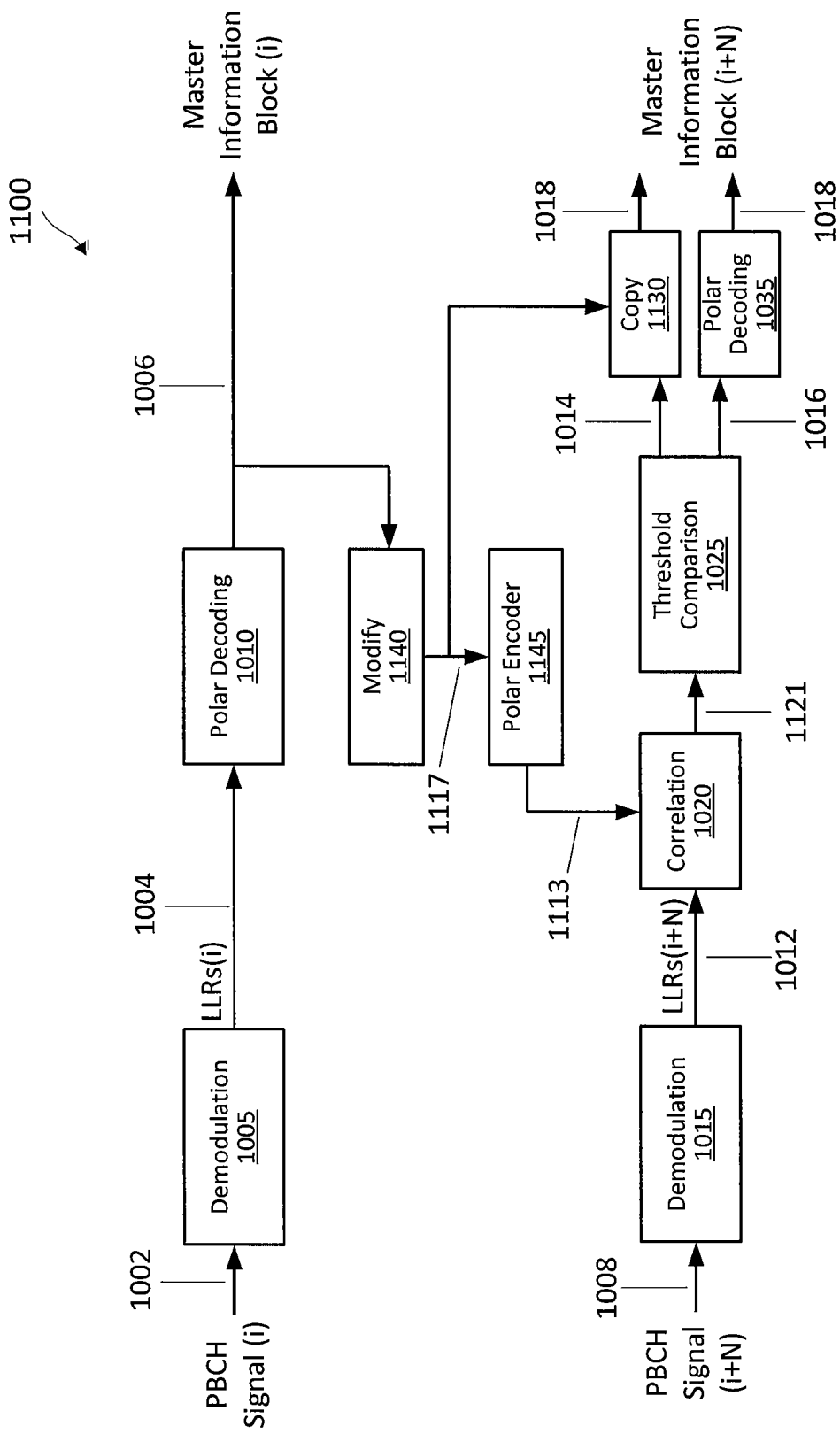
FIG. 11 is a block diagram of an exemplary system for decoding a master information block according to embodiments of the present disclosure.

FIG. 11 is a block diagram of an exemplary system 1100 for decoding a master information block (MIB) according to embodiments of the present disclosure. In some examples, the demodulation unit 1005, the polar decoding unit 1010, the correlation unit 1020, the threshold comparison unit 1025, the copy unit 1130, the polar decoding unit 1035, modify unit 1140, and the polar encoder unit 1145 of the system 1100 may be implemented by the processor 202 and/or PBCH processing module 208 of the UE 200 (FIG. 2).

Similar to system 1000, system 1100 may receive a PBCH signal 1002 in a time period (i), where the PBCH signal 1002 may include an encoded MIB according to embodiments of the present disclosure (i.e., the bit field arranged with sub-blocks with more or less frequently changing information). Also similar to system 1000, the system 1100 may generate the MIB 1006 corresponding to time period (i) that may be used by the UE to synchronize the UE at time period (i) with a network such as network 100 of FIG. 1.

Additionally, at time period (i+N), where N is an integer equal to or greater than one, the demodulation unit 1015 that can be the same demodulation unit 1005 may receive another PBCH signal 1008. The received PBCH signal 1008 may include an encoded MIB associated with time period (i+N). The demodulation unit 1015 may demodulate the received PBCH signal 1008 and may generate the encoded MIB 1012 associated with time period (i+N) in a codeword. As discussed with respect to FIGS. 6-9, the second sub-block of encoded MIBs 1004 and 1012 may be associated with the sub-block 607 of FIG. 6 that changes less frequently than the sub-block 605 (that may change from time period to next).

The system 1100 further includes a modify unit 1140 in communication with the output from the polar decoding unit 1010. In some embodiments, the modify unit 1140 of system 1100 may use the MIB 1006 corresponding to time period (i) to generate a modified, e.g., estimated, MIB for time period (i+N). In some examples, the estimated MIB for time period (i+N) is generated by copying the sub-block 607 of the MIB 1006 and further predicting the sub-block 605 to generate an estimated MIB 1117 for time period (i+N). Then the polar encoder unit 1145 of the system 1100 may add frozen bit and perform a polar coding to generate a first sub-block of the estimated encoded MIB 1113, where the second sub-block is copied from the MIB 1004.

In some examples, the correlation unit 1020 of system 1100 may compare the estimated encoded MIB 1113 and the encoded MIB 1012 (for example, comparing respective LLRs of the two MIBs) and generate the comparison value based on comparing, e.g., correlating. Thus, instead of comparing the previously received MIB (1004) with the newly received MIB (1012), the system 1100 compares the estimated MIB 1113 with the newly received MIB 1012.

The comparison value 1121 (like the comparison data/value 1021 from FIG. 10) is passed on to the threshold and comparison unit 1025. The threshold and comparison unit 1025 may compare the comparison value with a predetermined threshold value, such as discussed with respect to FIG. 10 above. The threshold and comparison unit 1025 may decide a "match" exists (e.g., as discussed with respect to FIG. 10 above, namely that the comparison value is below the predetermined threshold value) between the encoded MIB 1012 and the estimated encoded MIB 1113. If the match exists, the output value 1014 of the threshold and comparison unit 1025 may indicate the match to the update copy unit 1130. Thus, based on the match, the copy unit 1130 may receive (e.g., accept from the modify unit 1140) the estimated MIB 1117 as the MIB 1018 at time period (i+N). Again, if the match does not exist, the polar decoding unit 1035 may decode the entire encoded MIB 1012 to generate the MIB 1018 at time period (i+N).

As described, in some examples, in a UE, generating the MIB 1018 at time period (i+N) from the encoded MIB 1012 may not involve decoding where it may be accomplished by performing the encoding with the polar encoder unit 1145 of the system 1100 for at least a portion of the MIB, and then correlating the encoded MIB 1012 and the estimated encoded MIB 1113. This is because, in some examples, the estimated MIB for time period (i+N) is generated by determining the sub-block 607 of the estimated MIB using the sub-block 607 of the MIB 1006 and expected information about changes of the sub-block 607. This approach results in saving power and improving latency of the UE.

Figure 12:
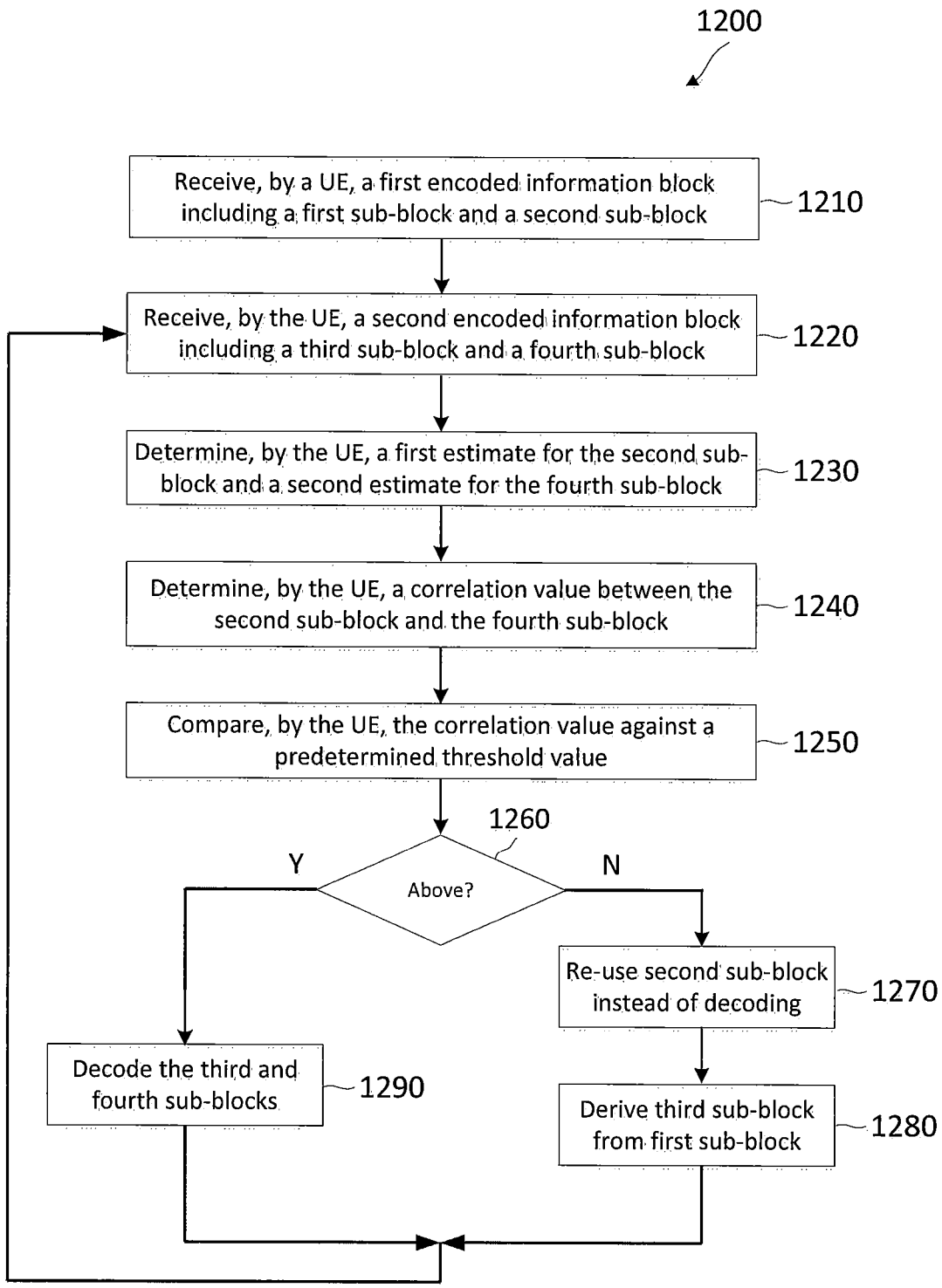
FIG. 12 is a flow diagram of an exemplary method of receiving a master information block by an exemplary UE according to embodiments of the present disclosure.

FIG. 12 is a flow diagram of a method 1200 of receiving a system master information block by an exemplary UE according to embodiments of the present disclosure. Aspects of the method 1200 may be executed by a computing device (e.g., a processor, processing circuit, and/or other suitable component) of a wireless communication device, such as the UEs 115 and 200 introduced above. As illustrated, the method 1200 includes a number of enumerated steps, but embodiments of the method 1200 may include additional steps before, after, and in between the enumerated steps. In some embodiments, one or more of the enumerated steps may be omitted or performed in a different order.

At block 1210, a wireless communication device receives a first encoded information block including a first sub-block and a second sub-block as arranged according to embodiments of the present disclosure. The wireless communication device may be a standalone NR UE. In some embodiments, the first sub-block includes information that changes more frequently than the information in the second sub-block. The first encoded information block may be received from a network, e.g., a NR network. In some examples, the receiving is performed by, for example, by the transceiver 210 of the UE 200.

At block 1220, the UE receives a second encoded information block including a third sub-block and a fourth sub-block. The second encoded information block is received, as discussed with respect to the other figures above, at a time subsequent to when the first encoded information block is received. The third sub-block may be associated with the first sub-block (i.e., correspond to each other as both containing the same types of information that change more often than that in the other sub-block), and the fourth sub-block may be associated with the second sub-block (i.e., correspond to each other as both containing the same types of information that change less often than that in the first/third sub-blocks). The second encoded information block may be received from a network, e.g., a NR network. In some examples, the receiving is performed by, for example, by the transceiver 210 of the UE 200.

In some embodiments, receiving the first encoded information block 1002 includes receiving a first signal carrying the first encoded information block. Receiving the second encoded information block 1008 includes receiving a second signal carrying the second encoded information block.

At block 1230, the UE determines, from the first signal received at block 1210, a first estimate for the second sub-block from the first signal. The UE also determines, from the second signal received at block 1220, a second estimate for the fourth sub-block. These may be done in any order, i.e. the UE may determine the first estimate when it is received after block 1210 (e.g., before the second signal is received), or determine both estimates after the second signal is received, etc.

In some embodiments, determining the first estimate of the second sub-block may include demodulating the first signal by the demodulation unit 1005 (FIG. 10) to produce a first plurality of log-likelihood ratios (LLRs) 1004 consistent with the first encoded MIB, then selecting a subset of the first plurality of LLRs (corresponding to the second sub-block of information) as the first estimate of the second sub-block. Moreover, in some embodiments, determining the second estimate of the fourth sub-block may include demodulating the second signal by the demodulation unit 1005 (FIG. 10) to produce a second plurality of LLRs 1012, and then selecting a subset of the second plurality of LLRs (corresponding to the fourth sub-block of information) as the second estimate of the fourth sub-block.

Further, in some embodiments, selecting the subset of the first plurality of LLRs 1004 may be based on a first frozen bit-interleaving placement, and the selection of the subset of the second plurality of LLRs 1012 may be based on a second frozen bit-interleaving placement. In alternative embodiments, selecting the subset of the first plurality of LLRs 1004 may be based on a first bit-reversal placement and selecting the subset of the second plurality of LLRs 1012 may be based on the first or a second bit-reversal placement.

At block 1240, the UE determines a correlation value between the second sub-block and the fourth sub-block based on the first and second estimates determined at block 1230. The correlation value may be determined by, for example, the correlation unit 1020 of the system 1000 and may be implemented by the PBCH processing module 208 and/or processor 202 of the UE 200. That may include, for example, the UE determining some normalization value (e.g., the NCC) as the correlation value, in preparation for comparison against the threshold.

At block 1250, the UE compares the correlation value determined at block 1240 against a predetermined threshold value. This may be done, for example, by the threshold comparison unit 1025 (FIG. 10).

At decision block 1260, the UE determines whether the correlation value compared against the predetermined threshold value is above or below the threshold (in some embodiments, the below may be equal to or below, while in other embodiments the above may be equal to or above). If the correlation value is below (or equal to or below where implemented in that manner), then the method 1200 proceeds to block 1270.

At block 1270, the UE adopts the second sub-block from the first signal as the fourth sub-block from the second signal, based on the determination that the two are likely the same from blocks 1250 and 1260. In other words, the UE does not decode the second signal, thereby saving on power and latency among other benefits.

At block 1280, the UE completes the second signal's decoded status by determining the third sub-block from the second signal by deriving it from the known first sub-block from the first signal. This is possible because the UE has a knowledge of the deterministic values arranged to be in the first sub-block (e.g., SFN, CRC, beam index, etc.) and the number of time periods that have elapsed since receiving the first signal.

Returning to decision block 1260, if instead the UE determines that the correlation value is above (or, in applicable embodiments, equal to or above) the predetermined threshold, then the method 1200 proceeds to block 1290. At block 1290, the UE decodes the fourth sub-block of the second encoded information block in response to determining that the second and fourth sub-blocks are not the same, and thus the second sub-block should not be re-used. The decoding may be performed, for example, by one of polar decoder units 1010 or 1035 of the system 1000 and may implemented by the PBCH processing module 208 and/or processor 202 of the UE 200.

Moreover, in some embodiments, the UE may also decode the third sub-block based on the polar code, e.g. by processor 202 or by the PBCH processing module 208 of UE 200. In alternative embodiments, the UE may determine the third sub-block from the second signal by deriving it from the known first sub-block from the first signal instead of from decoding the third sub-block. Either way, the method 1200 may also include concatenating the decoded/determined third sub-block and the decoded fourth sub-block to result in a decoded information block for use in the second time period.

In some embodiments, the method 1200 may continue with subsequently received encoded information blocks. For example, at a later time the UE may receive a third encoded information block including a fifth sub-block and a sixth sub-block. The fifth sub-block may be associated with the first sub-block (i.e., correspond to each other as both containing the same types of information that change more often than that in the other sub-block), and the sixth sub-block may be associated with the second sub-block (i.e., correspond to each other as both containing the same types of information that change less often than that in the first/fifth sub-blocks). In such scenarios, the method 1200 may continue in the manner discussed above with respect to blocks 1230-1290, including determining an estimate for the sixth sub-block (the second sub-block already having been estimated above), determining a comparison value between the second and sixth sub-blocks, comparing against a threshold (the same, or potentially a different value if the threshold is dynamically adjustable), and taking action based on whether the comparison value is above, at, or below the threshold. This is illustrated by the arrow returning to block 1220 in FIG. 12, for receiving the next information block.

Figure 13:
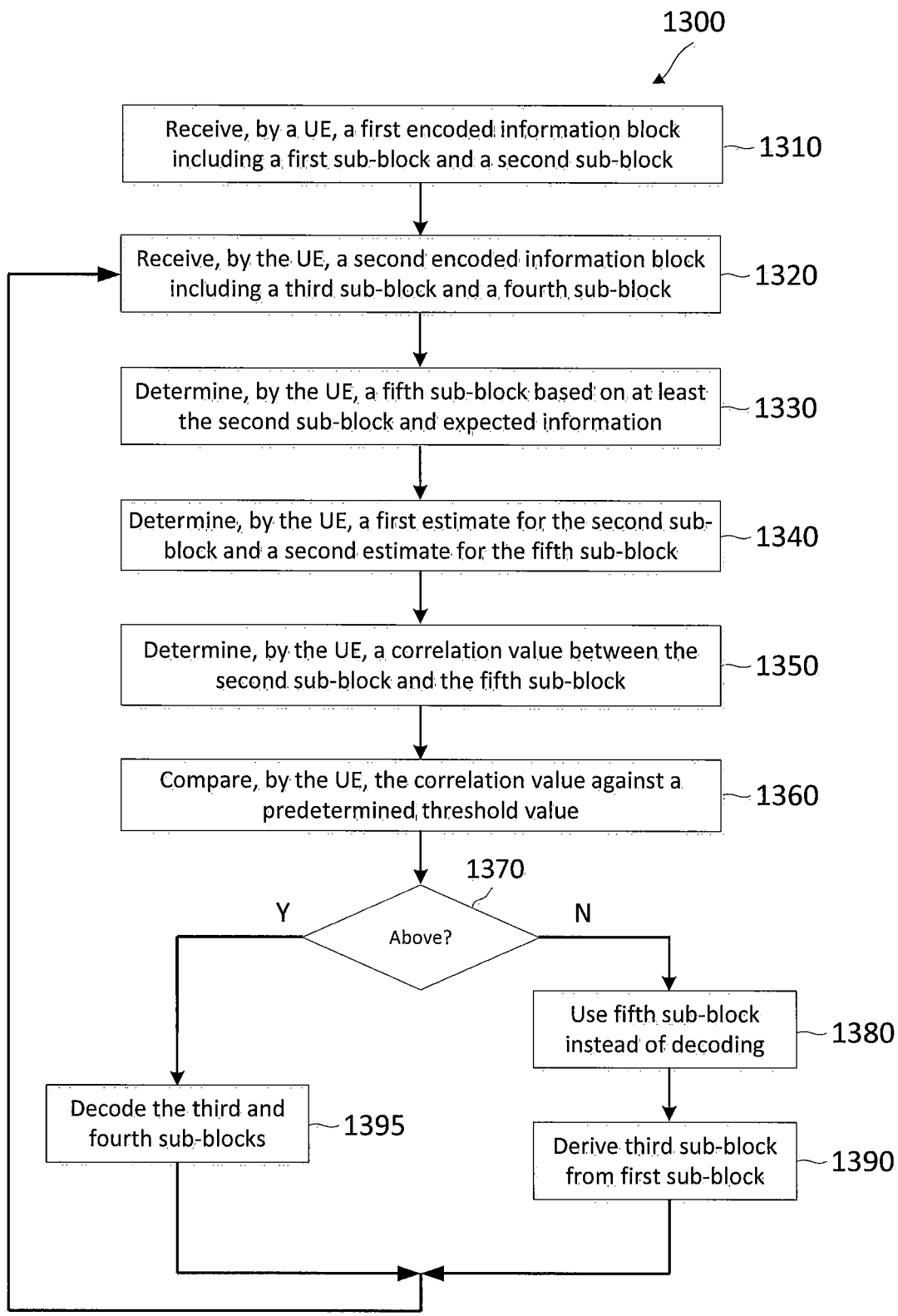
FIG. 13 is a flow diagram of an exemplary method of receiving a master information block by an exemplary UE according to embodiments of the present disclosure.

FIG. 13 is a flow diagram of a method 1300 of receiving a master information block by an exemplary UE according to embodiments of the present disclosure. Aspects of the method 1300 may be executed by a computing device (e.g., a processor, processing circuit, and/or other suitable component) of a wireless communication device, such as the UEs 115 and 200 introduced above. As illustrated, the method 1300 includes a number of enumerated steps, but embodiments of the method 1300 may include additional steps before, after, and in between the enumerated steps. In some embodiments, one or more of the enumerated steps may be omitted or performed in a different order.

At block 1310, a wireless communication device receives a first encoded information block including a first sub-block and a second sub-block, such as discussed above with respect to block 1210. The wireless communication device may be a standalone NR UE. In some embodiments, the first sub-block includes information that changes more frequently than the information in the second sub-block. The first encoded information block may be received from a network, e.g., a NR network. In some examples, the receiving is performed by, for example, by the transceiver 210 of the UE 200.

At block 1320, the UE receives a second encoded information block including a third sub-block and a fourth sub-block, for example at a time subsequent to receiving the first encoded information block. The third sub-block may be associated with the first sub-block (i.e., with a correspondence like that discussed with respect to block 1220), and the fourth sub-block may be associated with the second sub-block (i.e., with a correspondence like that discussed with respect to block 1220 as well). The second encoded information block may be received from a network, e.g., a NR network. In some examples, the receiving is performed by, for example, by the transceiver 210 of the UE 200.

At block 1330, the UE determines a fifth sub-block based on at least the second sub-block (from the first encoded information block received at block 1310) and expected information. The determination, for example, may be done by the modify unit 1140 of the system 1100 and may be implemented by the PBCH processing module 208 and/or processor 202 of the UE 200.

In some embodiments, receiving the first encoded information block 1002 includes receiving a first signal carrying the first encoded information block. In some examples, determining the fifth sub-block includes determining a first estimate for the second sub-block from the first signal, updating the first estimate based on the expected information, and encoding the updated first estimate based on the polar code to produce an encoded estimate.

At block 1340, the UE determines, from the first signal received at block 1310, a first estimate for the second sub-block from the first signal. The UE also determines, from the fifth sub-block estimated at block 1330, a second estimate for the fifth sub-block. As noted with respect to block 1230 of FIG. 12, these estimates may be LLRs of the values in the sub-blocks. Thus, instead of comparing the second sub-block with the fourth sub-block (received at block 1320), the UE compares the second sub-block with the fifth sub-block (estimated at block 1330).

At block 1350, the UE determines a correlation value between the second sub-block and the fifth sub-block. The determining, for example, may be done by correlation unit 1020 of the system 1100 and may implemented by the PBCH processing module 208 and/or processor 202 of the UE 200. The correlation value may be determined as an NCC value as discussed with respect to block 1240 of FIG. 12.

At block 1360, the UE compares the correlation value determined at block 1350 against a predetermined threshold value. This may be done, for example, by the threshold comparison unit 1025 (FIG. 11).

At decision block 1370, the UE determines whether the correlation value compared against the predetermined threshold value is above or below the threshold (in some embodiments, the below may be equal to or below, while in other embodiments the above may be equal to or above). If the correlation value is below (or equal to or below where implemented in that manner), then the method 1300 proceeds to block 1380.

At block 1380, the UE adopts the estimated fifth sub-block generated from the first signal as the fourth sub-block from the second signal, based on the determination that the two are likely the same from blocks 1360 and 1370. In other words, the UE does not decode the second signal, thereby saving on power and latency among other benefits by instead adopting the estimated fifth sub-block.

At block 1390, the UE completes the second signal's decoded status by determining the third sub-block from the second signal by deriving it from the known first sub-block from the first signal.

Returning to decision block 1370, if instead the UE determines that the correlation value is above (or, in applicable embodiments, equal to or above) the predetermined threshold, then the method 1300 proceeds to block 1395. At block 1395, the UE decodes the fourth sub-block of the second encoded information block in response to determining that the second and fifth sub-blocks are not the same, and thus the estimated fifth sub-block should not be used. The decoding may be performed, for example, by one of polar decoder units 1010 or 1035 of the system 1100 and may implemented by the PBCH processing module 208 and/or processor 202 of the UE 200.

Figure 14:
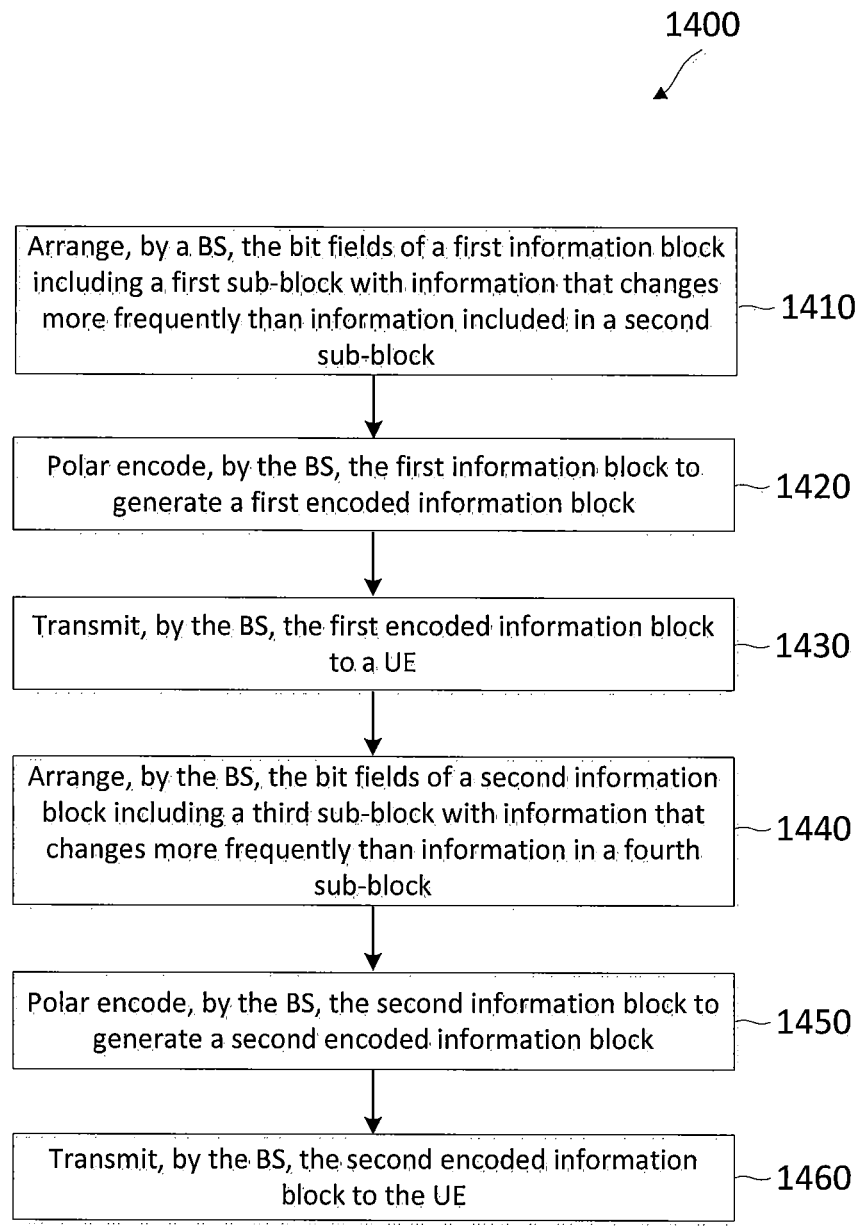
FIG. 14 is a flow diagram of an exemplary method of transmitting a master information block by an exemplary BS according to embodiments of the present disclosure.

FIG. 14 is a flow diagram of a method 1400 of transmitting a master information block by an exemplary BS according to embodiments of the present disclosure. Aspects of the method 1400 may be executed by a computing device (e.g., a processor, processing circuit, and/or other suitable component) of a wireless communication device, such as the BSs 105 and 300 introduced above. As illustrated, the method 1400 includes a number of enumerated steps, but embodiments of the method 1400 may include additional steps before, after, and in between the enumerated steps. In some embodiments, one or more of the enumerated steps may be omitted or performed in a different order.

At block 1410, a wireless communication device arranges the bit fields of a first information block so that the bit fields that may change more frequently than other bit fields/information are arranged in a first sub-block, and the bit fields that may change less frequently than those in the first sub-block are arranged in a second sub-block. Together, they constitute the first information block. The wireless communication device may be an NR BS of an NR network. In some examples, the arranging may be performed, for example, by the PBCH generation module 308 and/or processor 302 of the BS 300.

At block 1420, the BS polar encodes the first information block to generate a first encoded information block that includes the first sub-block and the second sub-block such that information in the first sub-block may change more frequently than information in the second sub-block. In some examples, the polar encoding is performed by, for example, by the PBCH generation module 308 and/or processor 302 of the BS 300.

At block 1430, the BS transmits the first encoded information block such that the second sub-block is positioned subsequent to the first sub-block. In some examples, the transmitting is performed by, for example, by the transceiver 310 of the BS 300. In some embodiments, transmitting the first encoded information block 1002 includes transmitting the first encoded information block 1002 through a physical broadcast channel during a first time period (i). Moreover, in some embodiments transmitting the first encoded information block 1002 includes transmitting a first signal carrying the first encoded information block.

At block 1440, similar to block 1410, the BS arranges the bit fields of a second information block so that the bit fields that may change more frequently than other bit fields/information are arranged in a third sub-block, and the bit fields that may change less frequently than those in the third sub-block are arranged in a fourth sub-block. Together, they constitute the second information block. In some examples, the arranging may be performed, for example, by the PBCH generation module 308 and/or processor 302 of the BS 300.

At block 1450, the BS polar encodes the second information block to generate a second encoded information block that includes the third sub-block and the fourth sub-block such that information in the third sub-block may change more frequently than information in the fourth sub-block. In some examples, the polar encoding is performed, for example, by the PBCH generation module 308 and/or processor 302 of the BS 300.

At block 1460, the BS transmits the second encoded information block such that the fourth sub-block is positioned subsequent to the third sub-block. In some examples, the transmitting is performed by, for example, by the transceiver 310 of the BS 300. In some embodiments, transmitting the second encoded information block 1008 includes transmitting the second encoded information block 1008 through the physical broadcast channel during a second time period (i+N) after the first time period, where N is one or more. Moreover, in some embodiments transmitting the second encoded information block 1008 includes transmitting a second signal carrying the second encoded information block.

In some examples, method 1400 includes interleaving the first information block and the second information block with respective frozen bits. Further, in some embodiments, method 1400 may include continuing in time to arrange, encode, and transmit additional information blocks, described simply herein as a third encoded information block including a fifth sub-block and a sixth sub-block. The fifth sub-block (referring generally to subsequent transmissions) may be associated with the first sub-block (i.e., with a correspondence like that discussed with respect to block 1220), and the sixth sub-block may be associated with the second sub-block (i.e., with a correspondence like that discussed with respect to block 1220 as well). The sixth sub-block may be positioned subsequent to the fifth sub-block in the third encoded information block, and the method 1400 may continue as laid out above.

Figure 15:
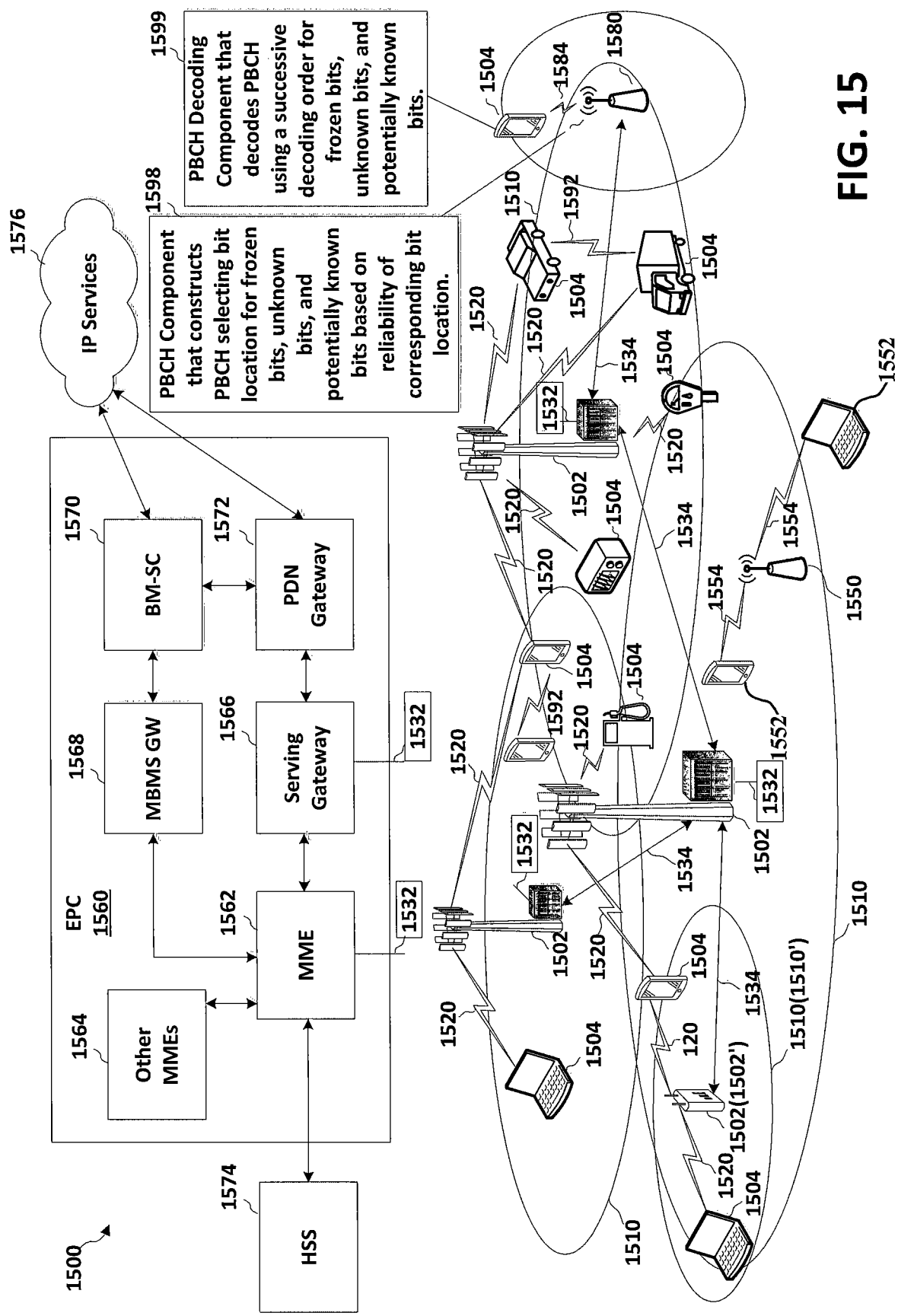
FIG. 15 is a diagram illustrating an example of a wireless communication system and an access network.

FIG. 15 is a diagram illustrating an example of a wireless communications system and an access network 1500. The wireless communications system (also referred to as a wireless wide area network (WWAN)) includes base stations 1502, UEs 1504, and an Evolved Packet Core (EPC) 1560. The base stations 1502 may include macro cells (high power cellular base station) and/or small cells (low power cellular base station). The macro cells include base stations. The small cells include femtocells, picocells, and microcells.

The base stations 1502 (collectively referred to as Evolved Universal Mobile Telecommunications System (UMTS) Terrestrial Radio Access Network (E-UTRAN)) interface with the EPC 1560 through backhaul links 1532 (e.g., S1 interface). In addition to other functions, the base stations 1502 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 1502 may communicate directly or indirectly (e.g., through the EPC 1560) with each other over backhaul links 1534 (e.g., X2 interface). The backhaul links 1534 may be wired or wireless.

The base stations 1502 may wirelessly communicate with the UEs 1504. Each of the base stations 1502 may provide communication coverage for a respective geographic coverage area 1510. There may be overlapping geographic coverage areas 1510. For example, the small cell 1502' may have a coverage area 1510' that overlaps the coverage area 1510 of one or more macro base stations 1502. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 1520 between the base stations 1502 and the UEs 1504 may include uplink (UL) (also referred to as reverse link) transmissions from a UE 1504 to a base station 1502 and/or downlink (DL) (also referred to as forward link) transmissions from a base station 1502 to a UE 1504. The communication links 1520 may use multiple-input and multiple-output (MIMO) antenna technology, including spatial multiplexing, beamforming, and/or transmit diversity. The communication links may be through one or more carriers. The base stations 1502/UEs 1504 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 1504 may communicate with each other using device-to-device (D2D) communication link 1592. The D2D communication link 1592 may use the DL/UL WWAN spectrum. The D2D communication link 1592 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 1550 in communication with Wi-Fi stations (STAs) 1552 via communication links 1554 in a 5 GHz unlicensed frequency spectrum. When communicating in an unlicensed frequency spectrum, the STAs 1552/AP 1550 may perform a clear channel assessment (CCA) prior to communicating in order to determine whether the channel is available.

The small cell 1502' may operate in a licensed and/or an unlicensed frequency spectrum. When operating in an unlicensed frequency spectrum, the small cell 1502' may employ NR and use the same 5 GHz unlicensed frequency spectrum as used by the Wi-Fi AP 1550. The small cell 1502', employing NR in an unlicensed frequency spectrum, may boost coverage to and/or increase capacity of the access network.

The gNodeB (gNB) 1580 may operate in millimeter wave (mmW) frequencies and/or near mmW frequencies in communication with the UE 1504. When the gNB 1580 operates in mmW or near mmW frequencies, the gNB 1580 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 1580 may utilize beamforming 1584 with the UE 1504 to compensate for the extremely high path loss and short range.

The EPC 1560 may include a Mobility Management Entity (MME) 1562, other MMEs 1564, a Serving Gateway 1566, a Multimedia Broadcast Multicast Service (MBMS) Gateway 1568, a Broadcast Multicast Service Center (BM-SC) 1570, and a Packet Data Network (PDN) Gateway 1572. The MME 1562 may be in communication with a Home Subscriber Server (HSS) 1574. The MME 1562 is the control node that processes the signaling between the UEs 1504 and the EPC 1560. Generally, the MME 1562 provides bearer and connection management. All user Internet protocol (IP) packets are transferred through the Serving Gateway 1566, which itself is connected to the PDN Gateway 1572. The PDN Gateway 1572 provides UE IP address allocation as well as other functions. The PDN Gateway 1572 and the BM-SC 1570 are connected to the IP Services 1576. The IP Services 1576 may include the Internet, an intranet, an IP Multimedia Subsystem (IMS), a PS Streaming Service, and/or other IP services. The BM-SC 1570 may provide functions for MBMS user service provisioning and delivery. The BM-SC 1570 may serve as an entry point for content provider MBMS transmission, may be used to authorize and initiate MBMS Bearer Services within a public land mobile network (PLMN), and may be used to schedule MBMS transmissions. The MBMS Gateway 1568 may be used to distribute MBMS traffic to the base stations 1502 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 1502 provides an access point to the EPC 1560 for a UE 1504. Examples of UEs 1504 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 1504 may be referred to as IoT devices (e.g., parking meter, gas pump, toaster, vehicles, etc.). The UE 1504 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 15, in certain aspects, the base station 1580 may be configured to include a PBCH component 1598 that is configured to construct a PBCH payload, wherein a bit location is selected for encoding a plurality of bits of the PBCH based on an estimated reliability for the corresponding bits location wherein the plurality of bits comprises frozen bits, unknown bits that are unknown to a user equipment, and potentially known bits that are potentially known by the user equipment. In other aspects, the UE 1504 may be configured to include a PBCH decoding component 1599 configured to decode a PBCH comprising frozen bits, unknown bits, and potentially known bits based on a successive decoding order.

A PBCH payload may include encoded bits that are already known to the UE, such as frozen bits. The PBCH payload may include encoded bits that are potentially known to the UE, and the UE may need to decode the PBCH for only a remaining set of unknown information.

The unknown information may include timing information, e.g., such as an SS block index, an SS burst-set index, a system frame number (SFN), and/or error detection bits. For example, the timing information may include CRC bits.

Thus, a part of the PBCH payload, or encoded PBCH bits, may already be known to the UE, and the UE may need to decode the PCBH for only the remaining, unknown information.

For example, a UE may potentially know most of the system information, e.g., MIB, for a neighbor cell PBCH, except for unknown timing information. This potentially known information may be known to the UE because it has been provided to the UE, e.g., a serving cell may provide such information regarding a neighbor cell to the UE. The PBCH may comprise frozen bits, which are also known by the UE. The UE may decode the partially known PBCH using at least part of the potentially known bits of the payload, as well as the frozen bits.

In one example, for a Polar coded PBCH, the potentially known payload may be treated as frozen bits in a decoding process at the UE.

For a given Polar code generator matrix $G_N$ of N×N, where $Q=(q_1, q_2, \ldots, q_N)$ is a bit location vector that provides the indices on input bits to the Polar encoder, $q_1, q_2, \ldots, q_N$ may be sorted based on an estimated reliability. For example, the input bits may be sorted such that $q_1$ is most reliable and so forth to $q_N$ being the least reliable. In some cases, reliability may be based on an estimate.

For example, for a simple generator matrix $$G_2 = \begin{bmatrix} 1 & 1 \\ 0 & 1 \end{bmatrix}$$

generator codeword $y=G_2 x$ for two-bit (column) vector x, we have Q=(2,1).

So, for a given $G_N$, we have a bit location vector Q. The, at the input of the encoder, K<N information bits are placed at the most reliable bit locations, and frozen bits (which are known bits) are the remaining N−K bit locations. The bit vector thus obtained is N×1 vector x. The encoder then produces an N bit codeword $y=G_N x$. At times, the transmitted codeword may be punctured to obtain fewer than N bits to transmit. In this case, bit location vector Q may be appropriately updated to reflect bit reliability based on the actually transmitted bits.

The frozen bits may be placed at the most unreliable bit locations. At least part of the potentially known bits may be placed on less reliable bit locations than those of unknown bits. Thus, the potentially known bits may be placed on bit locations with lower reliability than the reliability of bit locations where unknown bits are placed, in constructing the PBCH for transmission by the base station.

Given the location of potentially known bits, the UE may decode the PBCH based on a successive decoding of information bits. Frozen bits are already known by the UE and may not need to be decoded. The UE may decode the potentially known bits first and, then, may decode at least part of the unknown bits subsequently.

This may enable the UE to decode the PBCH for a neighbor cell more efficiently. For example, a UE may require a four shot PBCH decoding to obtain timing information such as an SS block index comprised in the PBCH. If a UE knows at least a part of the remaining bits for the neighbor cell PBCH, e.g., the bits other than the SS block index, the UE may treat those bits as frozen bits. This may enable the UE to obtain the SS block index with reduced decoding processing, e.g., with a single shot PBCH decoding.

Figure 16:
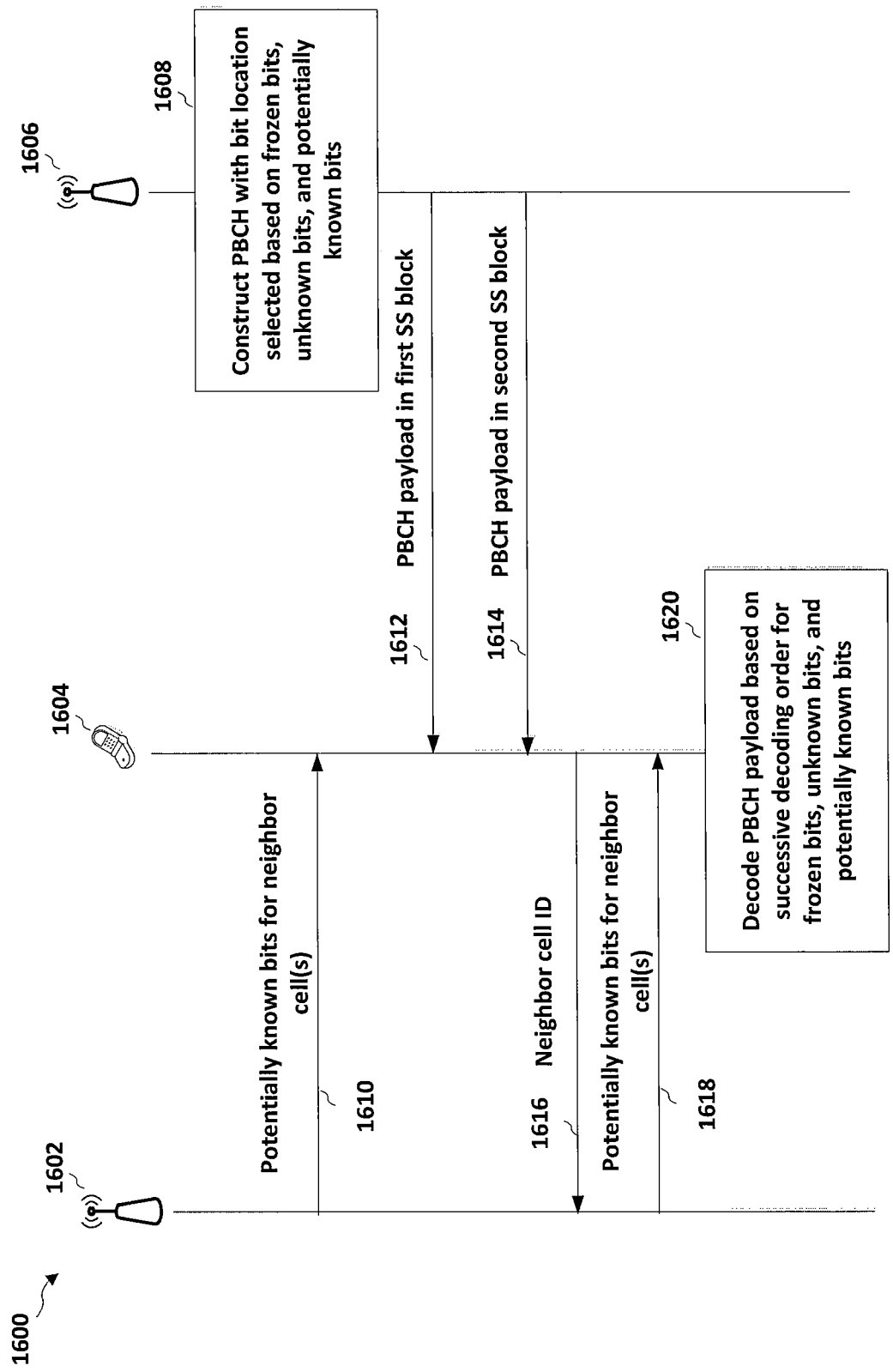
FIG. 16 illustrates an example of wireless communication between a UE and base stations.

FIG. 16 illustrates a communication flow 1600 between a UE 1604 (e.g., UE 1504), a first base station 1602 (e.g., base station 1580), and a second base station 1606 (e.g., base station 1680), in accordance with aspects presented herein. The first base station 1602 may be a serving base station, and the second base station may be a neighbor base station. The second base station 1606 may transmit PBCH in a plurality of SS blocks. Each SS block may comprise timing information included in the PBCH payload, such as an SS block index. For example, FIG. 16 illustrates the base station 1606 transmitting a first PBCH payload comprising first timing information in a first SS block 1612 and a second PBCH payload comprising second timing information in a second SS block 1614. At 1608, the base station 1606 may construct the PBCH at 1608 selecting bit locations for PBCH information based on an estimated reliability for the corresponding bit location. For example, frozen bits may be placed at the most unreliable bit locations, and at least part of the potentially known bits may be placed at less reliable bit locations than unknown bits.

The UE 1604 may decode the PBCH payload received from the base station 1606 based on a successive decoding order at 1620. Frozen bits may already be known and may not require decoding. The UE may first decode potentially known bits and subsequently decode the unknown bits.

As illustrated in FIG. 16, the potentially known bits may correspond to information regarding the second base station PBCH that is provided to the UE 1604 from the first base station 1602.

In a first example, a first cell may provide information regarding the second cell PBCH bits at 1610 to the UE 1604 prior to the UE reporting cell quality measurements for the second cell. For example, the UE 1604 may receive the information regarding the second base station PBCH from the first base station 1602 prior to receiving the PBCH from the second base station 1606. The UE 1604 may then detect the SS blocks of the second base station and may use the information 1610 received from the first base station 1602 to decode the second base station's PBCH using the successive decoding order at 1620. This may reduce PBCH decoding latency.

In this first example, a serving cell may provide information regarding PBCH bits of a plurality of surrounding neighbor cells for each served UE to use in reporting neighbor cell qualities. For example, the serving cell may provide information corresponding to a plurality of neighbor cell IDs. However, this may require the serving cell to provide a substantial amount of information to the UEs.

In a second example, the UE 1604 may detect the SS blocks from the second base station 1606 prior to receiving the information from the first base station 1602. The UE may detect the cell ID of the second base station 1606. Upon detecting the cell ID, the UE may report the cell ID to the first base station 1602 at 1616. In response to receiving the cell ID from the UE, the first base station 1602 may provide the PBCH bit information for the second base station 1606 to the UE at 1618. The UE may then use the information from the first cell 1602 to decode the second base station's PBCH using the successive decoding order at 1620.

In this second example, a serving cell may provide information regarding PBCH bits for a specific neighbor cell in response to a UE reporting the corresponding cell ID. While this may involve more latency than the first example, the second example reduces the RRC signaling overhead for the serving base station.

Thus, a first base station may provide information to assist the UE in deriving the reference time of a second base station, e.g., a serving cell may assist the UE in deriving the reference time of a target cell.

Figure 17:
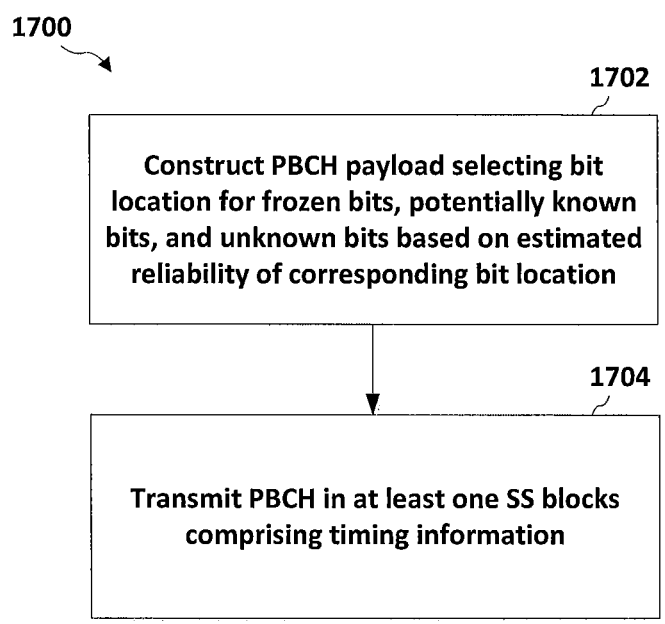
FIG. 17 is a flowchart of a method of wireless communication.

FIG. 17 is a flowchart 1700 of a method of wireless communication. The method may be performed by a base station (e.g., the base station 1502) communicating with a UE (e.g., UE 1504). At 1702, the base station constructs a PBCH payload, wherein a bit location is selected for encoding a plurality of bits of the PBCH based on an estimated reliability for the corresponding bits location wherein the plurality of bits comprises frozen bits, unknown bits that are unknown to a user equipment, and potentially known bits that are potentially known by the user equipment, e.g., as described in connection with 1608 in FIG. 16. The PBCH payload may comprise a polar coded PBCH. At least a part of the potentially known bits may be given a less reliable bit location than the unknown bits in encoding the PBCH payload. The frozen bits may be given a less reliable bit location than the potentially known bits in encoding the PBCH payload.

At 1704, the base station transmits the PBCH payload in at least one of a plurality of SS blocks, wherein each SS block comprises corresponding timing information. For example, each SS block may comprise an SS block index. Thus, the timing information may comprise at least one of an SS block index, an SS burst-set index, and a system frame number (SFN).

The unknown bits may comprise the timing information, e.g., at least one of an SS block index, an SS burst-set index, and an SFN. The unknown bits may include error detection bits, e.g., CRC bits.

The potentially known bits may comprise system information provided to the user equipment by a different cell. For example, such potentially known information may include any of numerology such as subcarrier spacing for other channels, a configuration of a common control resource set (CORESET), a configuration of transmission of remaining system information, system bandwidth, location of synchronization signals within the system bandwidth, and/or reserved bits. The potentially known information may include a part of a SFN, e.g., 8 MSBs out of a total of 10 bits of SFN. Thus, while the first cell might not be able to provide an exact timing of the second cell, the first cell may be able to provide a neighbor cell time within a certain level of precision, e.g., up to 20 ms precision.

Figure 18:
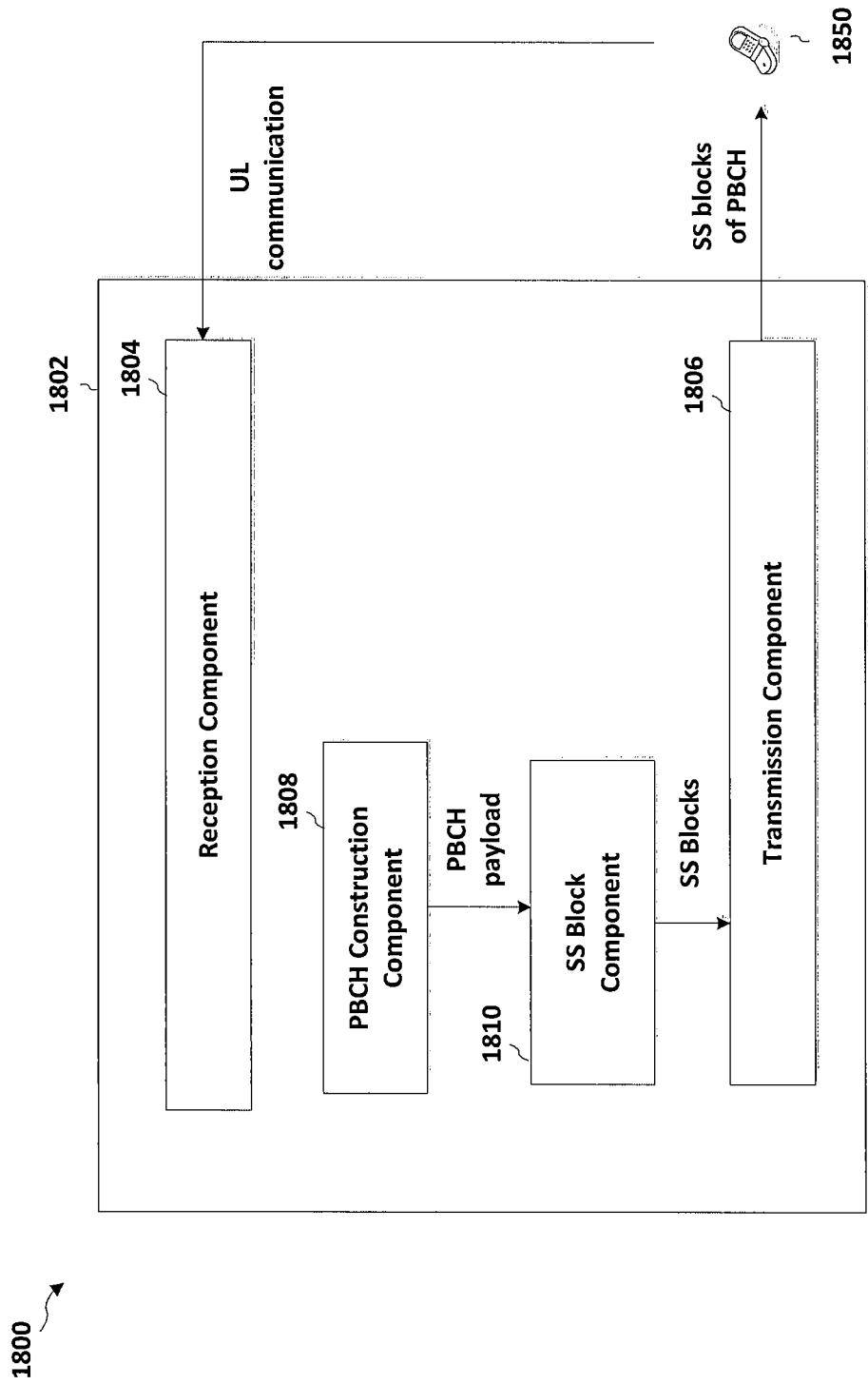
FIG. 18 is a conceptual data flow diagram illustrating the data flow between different means/components in an exemplary apparatus.

FIG. 18 is a conceptual data flow diagram 1800 illustrating the data flow between different means/components in an exemplary apparatus 1802. The apparatus may be a base station (e.g., base station 1580) communicating with UE 950 (e.g., UE 1504). The apparatus includes a reception component 1804 that receives uplink communication, and a transmission component 1806 that transmits DL communication to UEs, including PBCH. The apparatus may include a PBCH construction component 1808 configured to construct a PBCH payload, wherein a bit location is selected for encoding a plurality of bits of the PBCH based on an estimated reliability for the corresponding bits location wherein the plurality of bits comprises frozen bits, unknown bits that are unknown to a user equipment, and potentially known bits that are potentially known by the user equipment. For example, the PBCH construction component may give at least a part of potentially known bits a less reliable bit location than unknown bits and may give frozen bits a less reliable bit location than potentially known bits when encoding the PBCH. The apparatus may include an SS block component 1810 that is configured to transmit the PBCH payload, e.g., via transmission component 1806, in at least one of a plurality of SS blocks, wherein each SS block comprises corresponding timing information.

The apparatus may include additional components that perform each of the blocks of the algorithm in the aforementioned flowcharts of FIGS. 16 and 17. As such, each block in the aforementioned flowcharts of FIGS. 16 and 17 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 19:
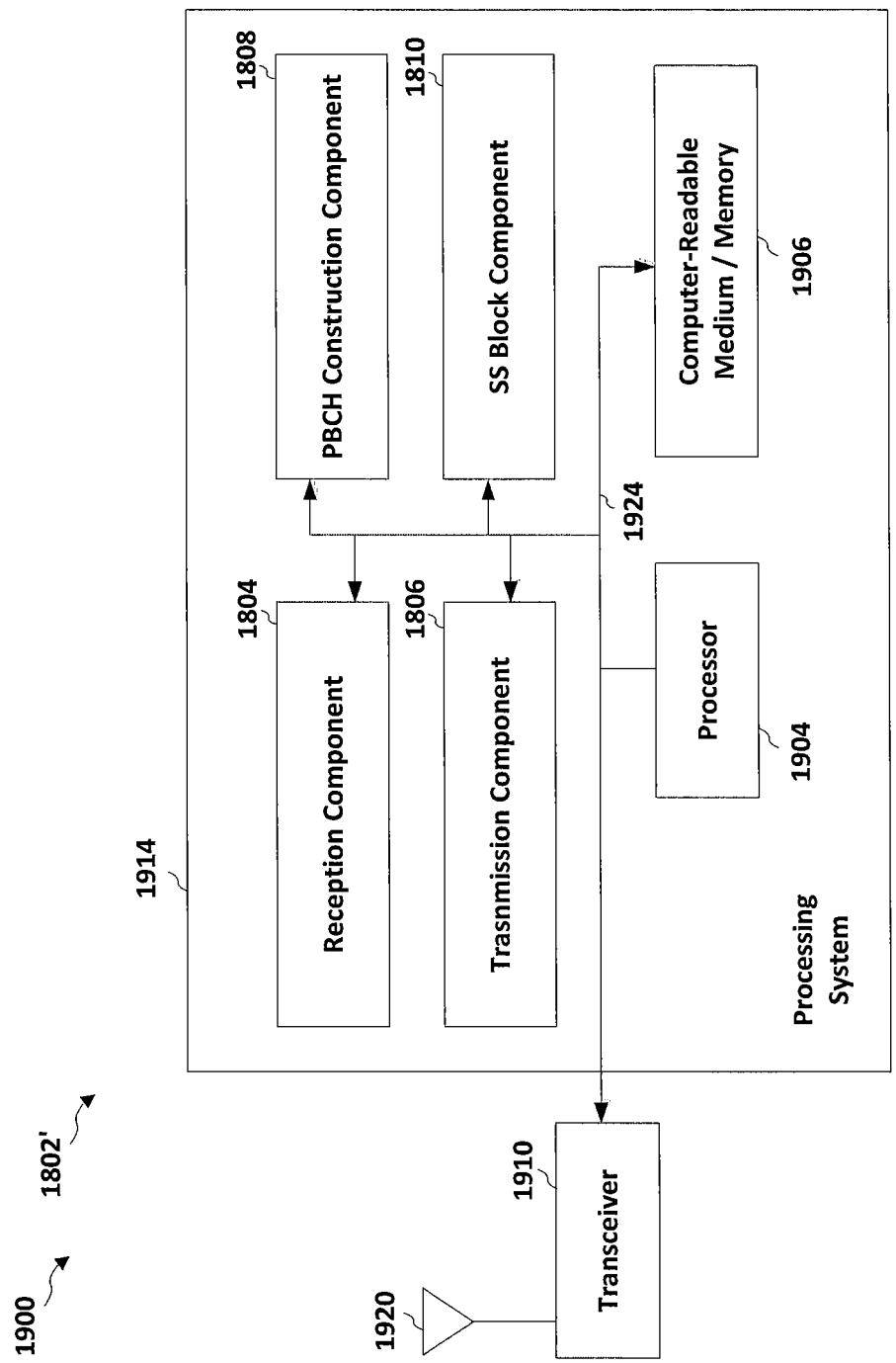
FIG. 19 is a diagram illustrating an example of a hardware implementation for an apparatus employing a processing system.

FIG. 19 is a diagram 1900 illustrating an example of a hardware implementation for an apparatus 1802' employing a processing system 1914. The processing system 1914 may be implemented with a bus architecture, represented generally by the bus 1924. The bus 1924 may include any number of interconnecting buses and bridges depending on the specific application of the processing system 1914 and the overall design constraints. The bus 1924 links together various circuits including one or more processors and/or hardware components, represented by the processor 1904, the components 1804, 1806, 1808, 1810, and the computer-readable medium/memory 1906. The bus 1924 may also link various other circuits such as timing sources, peripherals, voltage regulators, and power management circuits, which are well known in the art, and therefore, will not be described any further.

The processing system 1914 may be coupled to a transceiver 1910. The transceiver 1910 is coupled to one or more antennas 1920. The transceiver 1910 provides a means for communicating with various other apparatus over a transmission medium. The transceiver 1910 receives a signal from the one or more antennas 1920, extracts information from the received signal, and provides the extracted information to the processing system 1914, specifically the reception component 1804. In addition, the transceiver 1910 receives information from the processing system 1914, specifically the transmission component 1806, and based on the received information, generates a signal to be applied to the one or more antennas 1920. The processing system 1914 includes a processor 1904 coupled to a computer-readable medium/memory 1906. The processor 1904 is responsible for general processing, including the execution of software stored on the computer-readable medium/memory 1906. The software, when executed by the processor 1904, causes the processing system 1914 to perform the various functions described supra for any particular apparatus. The computer-readable medium/memory 1906 may also be used for storing data that is manipulated by the processor 1904 when executing software. The processing system 1914 further includes at least one of the components 1804, 1806, 1808, 1810. The components may be software components running in the processor 1904, resident/stored in the computer readable medium/memory 1906, one or more hardware components coupled to the processor 1904, or some combination thereof. The processing system 1914 may be a component of a base station and may include a memory and/or at least one of a TX processor, a RX processor, and a controller/processor.

In one configuration, the apparatus 1802 for wireless communication includes means for constructing a PBCH payload, wherein a bit location is selected for encoding a plurality of bits of the PBCH based on an estimated reliability for the corresponding bits location wherein the plurality of bits comprises frozen bits, unknown bits that are unknown to a user equipment, and potentially known bits that are potentially known by the user equipment, and means for transmitting the PBCH payload in at least one of a plurality of SS blocks, wherein each SS block comprises corresponding timing information. The aforementioned means may be one or more of the aforementioned components of the apparatus 1802 and/or the processing system 1914 of the apparatus 1802 configured to perform the functions recited by the aforementioned means. As described supra, the processing system 1914 may include the TX Processor, the RX Processor, and the controller/processor. As such, in one configuration, the aforementioned means may be the TX Processor, the RX Processor, and the controller/processor configured to perform the functions recited by the aforementioned means.

Figure 20:
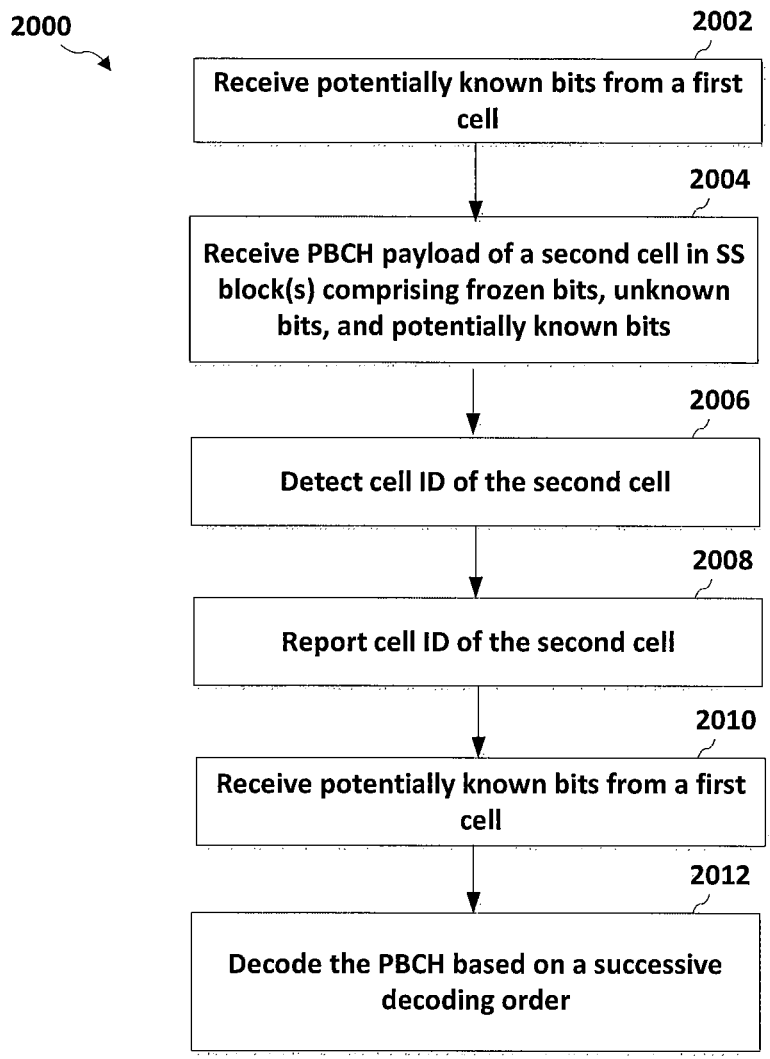
FIG. 20 is a flowchart of a method of wireless communication.

FIG. 20 is a flowchart 2000 of a method of wireless communication. The method may be performed by a UE (e.g., UE 1504) served by a first cell and receiving communication from a base station (e.g., the base station 1502) of a second cell. Optional aspects are illustrated with a dashed line. At 2004, the UE receives a PBCH payload of a second cell in at least one of a plurality of SS blocks, wherein each SS block comprises corresponding timing information, and wherein the PBCH payload comprises frozen bits, unknown bits that are unknown to the user equipment, and potentially known bits that are potentially known by the user equipment. The PBCH payload may comprise a polar coded PBCH.

At 2012, the UE decodes the PBCH based on a successive decoding order. The successive decoding order may be based on an estimated reliability for the corresponding bits. The potentially known bits may be decoded prior to the unknown bits. The potentially known bits may comprise system information provided to the user equipment by the first cell. The unknown bits may comprise the timing information, e.g., at least one of an SS block index, an SS burst-set index, and an SFN. The potentially known bits may comprise error detection bits, e.g., CRC bits.

In one example, as illustrated at 2002, the UE may receive, from the first cell, a plurality of potentially known bits corresponding to a cell ID for the second cell prior to reporting a cell quality. Then, at 2006, the UE may detect a cell ID of the second cell from a received SS block. The PBCH may be decoded based on the successive decoding order at 2012 using the bits obtained from the first cell.

In another example, the UE might not receive potentially known bits prior to receiving the PBCH at 2004. In this example, the UE may report the detected cell ID of the second cell to the first cell at 2008. Then, at 2010, the UE may receive, from the first cell, a plurality of potentially known bits corresponding to the cell ID for the second cell in response to the reporting the cell ID. The PBCH may be decoded based on the successive decoding order at 2012 using the bits obtained from the first cell.

Figure 21:
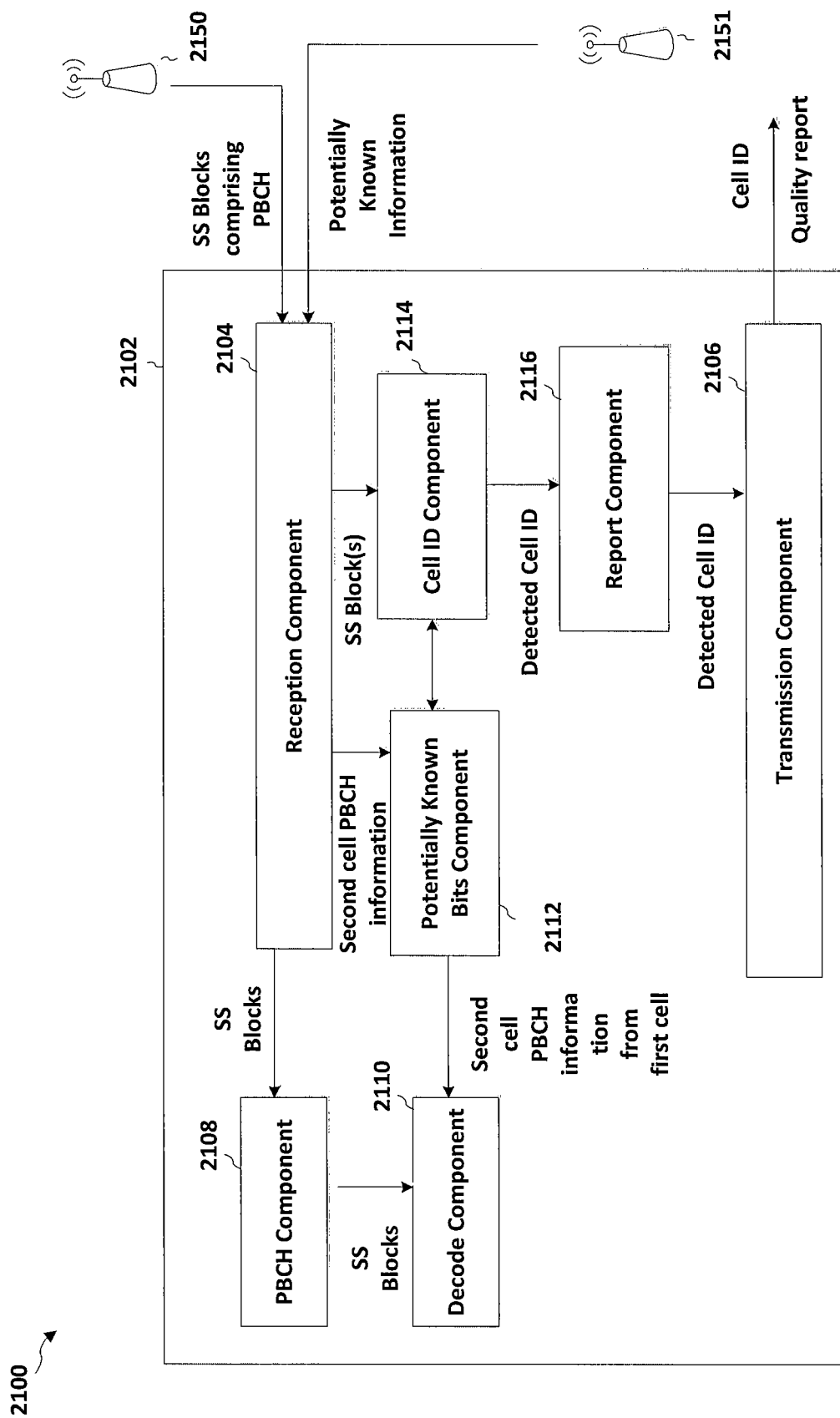
FIG. 21 is a conceptual data flow diagram illustrating the data flow between different means/components in an exemplary apparatus.

FIG. 21 is a conceptual data flow diagram 2100 illustrating the data flow between different means/components in an exemplary apparatus 2102. The apparatus may be a UE (e.g., UE 1504) communicating with a first base station 2151 (e.g., base station 1580) and with second base station 2150 (e.g., base station 1580). The apparatus includes a reception component 2104 that receives downlink communication from a first cell and a second cell, e.g., via first base station 2151 and second base station 2150. The apparatus includes a transmission component 2106 that transmits UL communication to base stations, e.g., 2150, 2151. The apparatus includes a PBCH component 2108 configured to receives a PBCH payload of a second cell in at least one of a plurality of SS blocks, wherein each SS block comprises corresponding timing information, and wherein the PBCH payload comprises frozen bits, unknown bits that are unknown to the user equipment, and potentially known bits that are potentially known by the user equipment.

The apparatus includes a decode component 2110 configured to decode the PBCH based on a successive decoding order. The successive decoding order may be based on an estimated reliability for the corresponding bits.

The apparatus may include a potentially known bits component 2112 configured to receive, from the first cell, a plurality of potentially known bits corresponding to a cell ID for the second cell. The apparatus may include a cell ID component 2114 configured to detect a cell ID of the second cell 2150. The potentially known bits may be received prior to detecting the cell ID, and the cell ID may be used to identify the potentially known bits for the corresponding second cell. In another example, the UE may detect the cell ID prior to receiving the potentially known bits. The apparatus may further include a report component 2116 configured to report the cell ID of the second cell to the first cell. Then, the potentially known bits for the second cell may be received in response to the reported cell ID.

The apparatus may include additional components that perform each of the blocks of the algorithm in the aforementioned flowcharts of FIGS. 16 and 20. As such, each block in the aforementioned flowcharts of FIGS. 16 and 20 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 22:
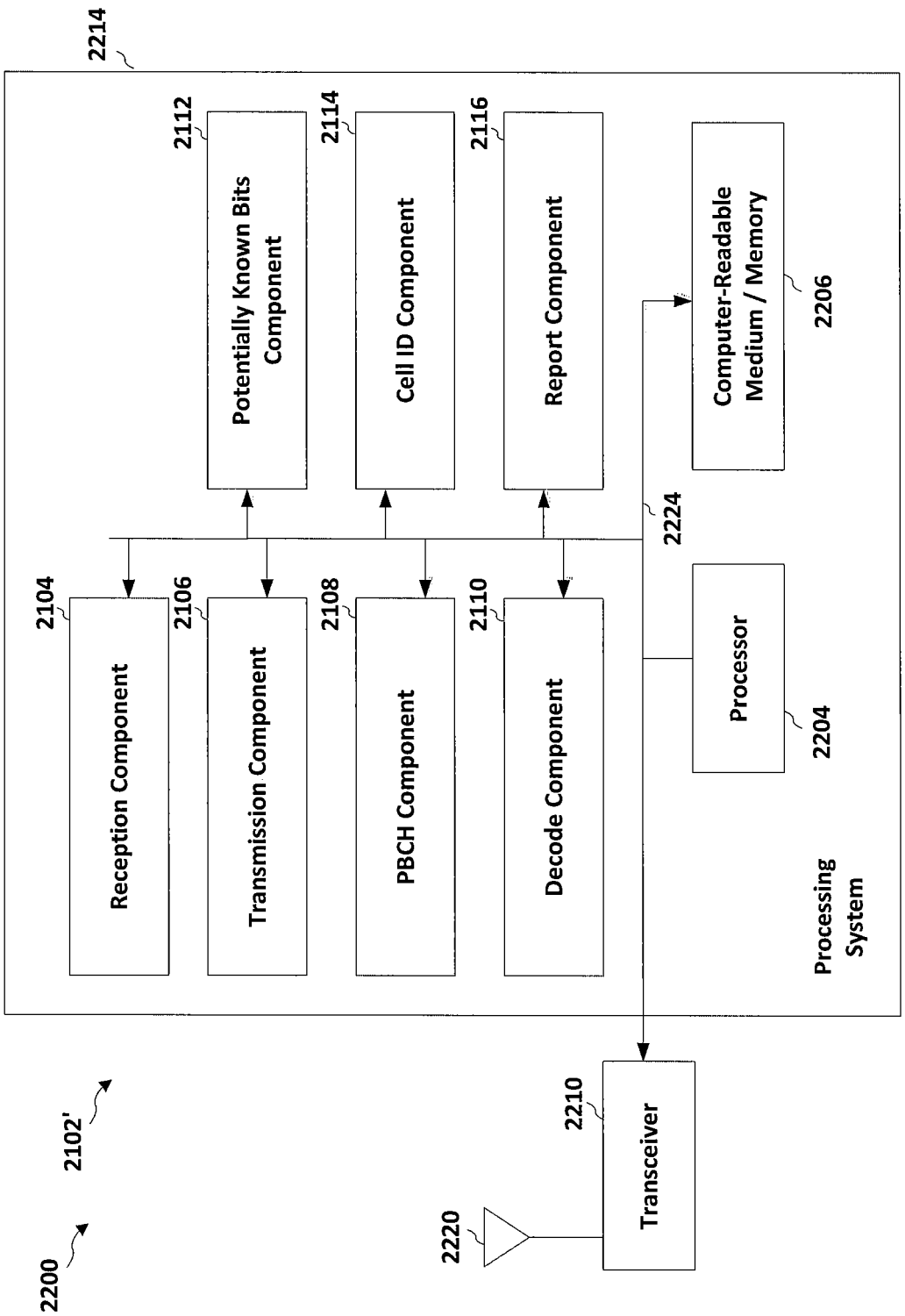
FIG. 22 is a diagram illustrating an example of a hardware implementation for an apparatus employing a processing system.

FIG. 22 is a diagram 2200 illustrating an example of a hardware implementation for an apparatus 2102' employing a processing system 2214. The processing system 2214 may be implemented with a bus architecture, represented generally by the bus 2224. The bus 2224 may include any number of interconnecting buses and bridges depending on the specific application of the processing system 2214 and the overall design constraints. The bus 2224 links together various circuits including one or more processors and/or hardware components, represented by the processor 2204, the components 2104, 2106, 2108, 2110, 2112, 2114, 2116, and the computer-readable medium/memory 2206. The bus 2224 may also link various other circuits such as timing sources, peripherals, voltage regulators, and power management circuits, which are well known in the art, and therefore, will not be described any further.

The processing system 2214 may be coupled to a transceiver 2210. The transceiver 2210 is coupled to one or more antennas 2220. The transceiver 2210 provides a means for communicating with various other apparatus over a transmission medium. The transceiver 2210 receives a signal from the one or more antennas 2220, extracts information from the received signal, and provides the extracted information to the processing system 2214, specifically the reception component 2204. In addition, the transceiver 2210 receives information from the processing system 2214, specifically the transmission component 2106, and based on the received information, generates a signal to be applied to the one or more antennas 2220. The processing system 2214 includes a processor 2204 coupled to a computer-readable medium/memory 2206. The processor 2204 is responsible for general processing, including the execution of software stored on the computer-readable medium/memory 2206. The software, when executed by the processor 2204, causes the processing system 2214 to perform the various functions described supra for any particular apparatus. The computer-readable medium/memory 2206 may also be used for storing data that is manipulated by the processor 2204 when executing software. The processing system 2214 further includes at least one of the components 2104, 2106, 2108, 2110, 2112, 2114, 2116. The components may be software components running in the processor 2204, resident/stored in the computer readable medium/memory 2206, one or more hardware components coupled to the processor 2204, or some combination thereof. The processing system 2214 may be a component of the UE and may include the memory and/or at least one of the TX processor, the RX processor, and the controller/processor.

In one configuration, the apparatus 2102/2102' for wireless communication includes means for receiving a PBCH payload of a second cell in at least one of a plurality of SS blocks, wherein each SS block comprises corresponding timing information, and wherein the PBCH payload comprises frozen bits, unknown bits that are unknown to the user equipment, and potentially known bits that are potentially known by the user equipment, means for decoding the PBCH based on a successive decoding order, means for receiving, from the first cell, a plurality of potentially known bits corresponding to a cell ID for the second cell prior to reporting a cell quality, means for detecting a cell ID of the second cell from a received SS block, means for reporting the cell ID of the second cell to the first cell, and means for receiving, from the first cell, a plurality of potentially known bits corresponding to the cell ID for the second cell in response to the reporting the cell ID. The aforementioned means may be one or more of the aforementioned components of the apparatus 2102 and/or the processing system 2214 of the apparatus 2202' configured to perform the functions recited by the aforementioned means. As described supra, the processing system 2214 may include a TX Processor, a RX Processor, and a controller/processor. As such, in one configuration, the aforementioned means may be the TX Processor, the RX Processor, and the controller/processor configured to perform the functions recited by the aforementioned means.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A method of wireless communication, comprising:
encoding, by a first wireless communication device, first information in a first sub-block having a first bit location and second information in a second sub-block having a second bit location after the first bit location into an encoded information block;
wherein the first bit location is located earlier in a decoding order of a receiving second wireless communication device than the second bit location; and
transmitting, by the first wireless communication device, the encoded information block to the receiving second wireless communication device.

2. The method of claim 1, wherein the first information comprises system frame information.

3. The method of claim 1, wherein the second information comprises scheduling information.

4. The method of claim 1, further comprising:
selecting the first bit location based on a first estimated reliability for the first bit location; and
selecting the second bit location based on a second estimated reliability for the second bit location, wherein the first estimated reliability is less than the second estimated reliability.

5. The method of claim 1, wherein the encoding comprises polar encoding.

6. The method of claim 5, wherein the encoded information block comprises a first encoded information block, the method further comprising:
polar encoding, by the first wireless communication device, third information in a third sub-block and fourth information in a fourth sub-block, the third sub-block being associated with the first sub-block and the fourth sub-block being associated with the second sub-block, into a second encoded information block; and
transmitting, by the first wireless communication device, the second encoded information block after the encoded information block to the receiving second wireless communication device.

7. The method of claim 6, wherein:
the first sub-block comprises a first plurality of information, the second sub-block comprises a second plurality of information, the third sub-block comprises a third plurality of information, and the fourth sub-block comprises a fourth plurality of information;
the polar encoding for the first encoded information block comprises combining the first information with first elements from the first and second pluralities of information, and the second information with second elements from the second plurality of information; and
the polar encoding for the second encoded information block comprises combining the third information with third elements from the third and fourth pluralities of information, and the fourth information with fourth elements from the fourth plurality of information.

8. The method of claim 7, wherein the polar encoding of the first and second encoded information blocks comprises a natural order encoding.

9. The method of claim 6, wherein:
the polar encoding the first and second sub-blocks comprises positioning the second sub-block subsequent to the first sub-block in the first encoded information block; and
the polar encoding the third and fourth sub-blocks comprises positioning the fourth sub-block subsequent to the third sub-block in the second encoded information block.

10. The method of claim 1, wherein the first information comprises a beam index.

11. A method of wireless communication, comprising:
receiving, by a first wireless communication device, an encoded information block from a second wireless communication device, the encoded information block comprising a first sub-block having a first bit location and a second sub-block having a second bit location after the first bit location;
decoding, by the first wireless communication device, the first sub-block; and
decoding, by the first wireless communication device, the second sub-block after the first sub-block.

12. The method of claim 11, wherein the first sub-block comprises system frame number information.

13. The method of claim 11, wherein the second sub-block comprises scheduling information.

14. The method of claim 11, wherein the encoded information block comprises a first encoded information block, the method further comprising:
receiving, by the first wireless communication device, a second encoded information block from the second wireless communication device, the second encoded information block comprising a third sub-block and a fourth sub-block, the third sub-block being associated with the first sub-block, and the fourth sub-block being associated with the second sub-block;
determining, by the first wireless communication device, a correlation value between the second sub-block and the fourth sub-block; and
adopting, by the first wireless communication device, the information included in the second sub-block as information included in the fourth sub-block in place of decoding the second encoded information block, in response to determining that the correlation value is less than a threshold.

15. The method of claim 14, further comprising:
decoding, by the first wireless communication device, the fourth sub-block of the second encoded information block in response to determining that the correlation value is greater than the threshold.

16. The method of claim 14, further comprising:
determining, by the first wireless communication device, a first plurality of log-likelihood ratios (LLRs) from the first encoded information block as a first estimate for the second sub-block; and
determining, by the first wireless communication device, a second plurality of LLRs from the second encoded information block as a second estimate for the fourth sub-block.

17. The method of claim 16, wherein:
selecting a subset of the first plurality of LLRs for the first estimate, wherein the selecting the subset of the first plurality of LLRs is based on a first bit-reversal placement, and selecting a subset of the second plurality of LLRs for the second estimate, wherein the selecting the subset of the second plurality of LLRs is based on a second bit-reversal placement.

18. The method of claim 16, wherein:
the determining the correlation value comprises comparing, by the first wireless communication device, the first and second estimates to each other to determine the correlation value; and
normalizing, by the first wireless communication device, the correlation value to generate a normalized correlation coefficient, the normalized correlation coefficient being compared against the threshold.

19. The method of claim 11, wherein the first sub-block comprises a beam index.

20. An apparatus, comprising:
a memory;
a processor coupled to the memory, the memory and the processor configured to:
encode first information in a first sub-block having a first bit location and second information in a second sub-block having a second bit location after the first bit location into an encoded information block;
wherein the first bit location is located earlier in a decoding order of a wireless communication device than the second bit location; and
a transceiver configured to transmit the encoded information block to the wireless communication device.

21. The apparatus of claim 20, wherein the first information comprises system frame information.

22. The apparatus of claim 20, wherein the second information comprises scheduling information.

23. The apparatus of claim 20, wherein the memory and the processor are further configured to:
polar encode the first and second information as the encoded information block.

24. The apparatus of claim 23, wherein the encoded information block comprises a first encoded information block and the memory and the processor are further configured to:
polar encode third information in a third sub-block and fourth information in a fourth sub-block, the third sub-block being associated with the first sub-block and the fourth sub-block being associated with the second sub-block, into a second encoded information block,
wherein the transceiver is further configured to transmit the second encoded information block after the encoded information block to the wireless communication device.

25. The apparatus of claim 24, wherein:
the first sub-block comprises a first plurality of information, the second sub-block comprises a second plurality of information, the third sub-block comprises a third plurality of information, and the fourth sub-block comprises a fourth plurality of information;
the memory and the processor are further configured, as part of the polar encoding for the first encoded information block, combine the first information with first elements from the first and second pluralities of information, and the second information with second elements from the second plurality of information; and
the memory and the processor are further configured, as part of the polar encoding for the second encoded information block, to combine the third information with third elements from the third and fourth pluralities of information, and the fourth information with fourth elements from the fourth plurality of information.

26. The apparatus of claim 25, wherein the polar encoding of the first and second information blocks comprises a natural order encoding.

27. The apparatus of claim 25, wherein the polar encoding of the first and second information blocks comprises a reverse order encoding.

28. The apparatus of claim 24, wherein the memory and the processor are further configured to:
position the second sub-block subsequent to the first sub-block in the first encoded information block; and
position the fourth sub-block subsequent to the third sub-block in the second encoded information block.

29. The apparatus of claim 20, wherein the first information comprises a beam index.

30. An apparatus, comprising:
a transceiver configured to receive, by the apparatus, an encoded information block from a wireless communication device, the encoded information block comprising a first sub-block having a first bit location and a second sub-block having a second bit location after the first bit location;
a memory; and
a processor coupled to the memory, the memory and the processor configured to decode the first sub-block and decode the second sub-block after the first sub-block.

31. The apparatus of claim 30, wherein the first sub-block comprises system frame number information.

32. The apparatus of claim 30, wherein the second sub-block comprises scheduling information.

33. The apparatus of claim 30, wherein:
the encoded information block comprises a first encoded information block;
the transceiver is further configured to receive a second encoded information block from the wireless communication device, the second encoded information block comprising a third sub-block and a fourth sub-block, the third sub-block being associated with the first sub-block, and the fourth sub-block being associated with the second sub-block; and
the memory and the processor are further configured to determine a correlation value between the second sub-block and the fourth sub-block and adopt the information included in the second sub-block as information included in the fourth sub-block in place of decoding the second encoded information block in response to determining that the correlation value is less than a threshold.

34. The apparatus of claim 33, wherein the memory and the processor are further configured to:
decode the fourth sub-block of the second encoded information block in response to the determination that the correlation value is greater than the threshold.

35. The apparatus of claim 33, wherein the memory and the processor are further configured to:
determine a first plurality of log-likelihood ratios (LLRs) from the first encoded information block as a first estimate for the second sub-block; and
determine a second plurality of LLRs from the second encoded information block as a second estimate for the fourth sub-block.

36. The apparatus of claim 35, wherein the memory and the processor are further configured to:
select a subset of the first plurality of LLRs for the first estimate, wherein the selection of the subset of the first plurality of LLRs is based on a first bit-reversal placement; and
select a subset of the second plurality of LLRs for the second estimate, wherein the selection of the subset of the second plurality of LLRs is based on a second bit-reversal placement.

37. The apparatus of claim 35, wherein the memory and the processor are further configured to:
- compare, as part of the determination of the correlation value, the first and second estimates to each other to determine the correlation value; and
- normalize the correlation value to generate a normalized correlation coefficient, the normalized correlation coefficient being compared against the threshold.

38. The apparatus of claim 30, wherein the apparatus comprises a user equipment and the wireless communication device comprises an evolved node B.

39. The apparatus of claim 30, wherein the first sub-block comprises a beam index.

40. A non-transitory computer-readable medium having program code recorded thereon, the program code comprising:
- code for causing a first wireless communication device to encode first information in a first sub-block having a first bit location and second information in a second sub-block having a second bit location after the first bit location into an encoded information block;
- wherein the first bit location is located earlier in a decoding order of a receiving second wireless communication device than the second bit location; and
- code for causing the first wireless communication device to transmit the encoded information block to the receiving second wireless communication device.

41. The non-transitory computer-readable medium of claim 40, wherein the second information comprises scheduling information.

42. The non-transitory computer-readable medium of claim 40, wherein the encoding comprises polar encoding.

43. The non-transitory computer-readable medium of claim 40, wherein the first information comprises a beam index.

44. A non-transitory computer-readable medium having program code recorded thereon, the program code comprising:
- code for causing a first wireless communication device to receive an encoded information block from a second wireless communication device, the encoded information block comprising a first sub-block having a first bit location and a second sub-block having a second bit location after the first bit location;
- code for causing the first wireless communication device to decode the first sub-block; and
- code for causing the first wireless communication device to decode the second sub-block after the first sub-block.

45. The non-transitory computer-readable medium of claim 44, wherein the second sub-block comprises scheduling information.

46. The non-transitory computer-readable medium of claim 44, wherein the first sub- block comprises a beam index.

47. An apparatus, comprising
- means for encoding first information in a first sub-block having a first bit location and second information in a second sub-block having a second bit location after the first bit location into an encoded information block;
- wherein the first bit location is located earlier in a decoding order of a receiving wireless communication device than the second bit location; and
- means for transmitting the encoded information block to the receiving wireless communication device.

48. The apparatus of claim 47, wherein the second information comprises scheduling information.

49. The apparatus of claim 47, wherein the encoding comprises polar encoding.

50. The apparatus of claim 47, wherein the first information comprises a beam index.

51. An apparatus, comprising:
- means for receiving an encoded information block from a wireless communication device, the encoded information block comprising a first sub-block having a first bit location and a second sub-block having a second bit location after the first bit location;
- means for decoding the first sub-block; and
- means for decoding the second sub-block after the first sub-block.

52. The apparatus of claim 51, wherein the second sub-block comprises scheduling information.

53. The apparatus of claim 51, wherein the first sub-block comprises a beam index.

* * * * *